United States Patent
Lin et al.

(10) Patent No.: US 10,984,870 B2
(45) Date of Patent: Apr. 20, 2021

(54) ADJUSTING READ VOLTAGE LEVEL IN REWRITABLE NONVOLATILE MEMORY MODULE

(71) Applicant: PHISON ELECTRONICS CORP., Miaoli (TW)

(72) Inventors: Wei Lin, Taipei (TW); An-Cheng Liu, Taipei (TW); Szu-Wei Chen, New Taipei (TW); Yu-Siang Yang, New Taipei (TW)

(73) Assignee: PHISON ELECTRONICS CORP., Miaoli (TW)

(*) Notice: Subject to any disclaimer, the term of this patent is extended or adjusted under 35 U.S.C. 154(b) by 1 day.

(21) Appl. No.: 16/292,338

(22) Filed: Mar. 5, 2019

(65) Prior Publication Data
US 2020/0227120 A1    Jul. 16, 2020

(30) Foreign Application Priority Data

Jan. 11, 2019   (TW) .................................. 108101276

(51) Int. Cl.
| | | |
|---|---|---|
| *G11C 16/12* | (2006.01) | |
| *G11C 11/4091* | (2006.01) | |
| *G11C 16/34* | (2006.01) | |
| *G11C 16/26* | (2006.01) | |

(52) U.S. Cl.
CPC .......... *G11C 16/12* (2013.01); *G11C 11/4091* (2013.01); *G11C 16/26* (2013.01); *G11C 16/3481* (2013.01)

(58) Field of Classification Search
None
See application file for complete search history.

(56) References Cited

U.S. PATENT DOCUMENTS

| | | | | |
|---|---|---|---|---|
| 2016/0148703 A1* | 5/2016 | Kim | ....................... | G11C 16/26 365/185.11 |
| 2018/0341552 A1* | 11/2018 | Liikanen | ............. | G06F 11/0793 |
| 2019/0043588 A1* | 2/2019 | Fisher | .................... | G11C 16/26 |
| 2019/0214092 A1* | 7/2019 | Jang | ....................... | G11C 16/26 |
| 2019/0354313 A1* | 11/2019 | Sheperek | .............. | G06F 3/0604 |

* cited by examiner

*Primary Examiner* — J. H. Hur
(74) *Attorney, Agent, or Firm* — JCIPRNET

(57) ABSTRACT

A memory control method for a rewritable non-volatile memory module is provided according to an exemplary embodiment of the disclosure. The method includes: reading a first physical unit based on a first read voltage level to obtain first data; reading the first physical unit based on a second read voltage level to obtain second data; reading the first physical unit based on a third read voltage level to obtain third data; obtaining a first reference value which reflects a data variation status between the first data and the second data; obtaining a second reference value which reflects a data variation status between the first data and the third data; reading the first physical unit based on a fourth read voltage level to obtain fourth data according to the first reference value and the second reference value; and decoding the fourth data by a decoding circuit.

21 Claims, 12 Drawing Sheets

ADJUSTING READ VOLTAGE LEVEL IN REWRITABLE NONVOLATILE MEMORY MODULE

CROSS-REFERENCE TO RELATED APPLICATION

This application claims the priority benefit of Taiwan application serial no. 108101276, filed on Jan. 11, 2019. The entirety of the above-mentioned patent application is hereby incorporated by reference herein and made a part of this specification.

BACKGROUND

Technical Field

The disclosure relates to a memory control technology, and more particularly to a memory control method, a memory storage device, and a memory control circuit unit.

Description of Related Art

Digital cameras, mobile phones, and MP3 players have been growing very quickly in recent years, causing consumer demand for storage media to increase rapidly. Since a rewritable non-volatile memory module (e.g. a flash memory) has characteristics such as data non-volatile, power saving, small size, no mechanical structure, etc., the rewritable non-volatile memory module is very suitable to be built in the various portable multimedia devices exemplified above.

The memory cells in the memory storage device store data in the form of voltage. For example, a memory cell within a certain voltage range may be used to store a bit of "0", while a memory cell within another voltage range may be used to store a bit of "1" or the like. However, after a period of use of the memory storage device, the memory cells may be weared and thereby causing a voltage offset. In some cases, the error bits that are affected by the voltage offset may be corrected by decoding the data read from the memory cells.

In a typical decoding process, a hard bit decoding mode is first activated to provide fast and low complexity decoding capabilities. For example, in the hard bit decoding mode, only one read voltage level is used at one time to read a data bit (also known as a hard bit) of the memory cell, and this single one read voltage level may be adjusted according to a retry table provided by a vender of the memory module. After determining that the hard bit decoding mode is failed, a soft bit decoding mode may be activated to provide a slower but more complex decoding capability. For example, in the soft bit decoding mode, more read voltage levels may be used to read one single memory cell for obtaining additional information (also known as soft bits). According to the soft bits, the decoding success rate of data may be improved, but the disadvantage is that the decoding speed may be greatly reduced.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a memory control method, a memory storage device, and a memory control circuit unit, which are capable of effectively improving a decoding success rate of read data before entering a soft bit decoding mode and thereby improving a data access performance of the memory storage device.

A memory control method for a rewritable non-volatile memory module which includes a plurality of physical units is provided according to an exemplary embodiment of the disclosure. The memory control method includes: sending a first read command sequence which instructs a reading of a first physical unit among the physical units based on a first read voltage level to obtain first data; sending a second read command sequence which instructs a reading of the first physical unit based on a second read voltage level to obtain second data; sending a third read command sequence which instructs a reading of the first physical unit based on a third read voltage level to obtain third data; obtaining a first reference value according to the first data and the second data, wherein the first reference value reflects a data variation status between the first data and the second data; obtaining a second reference value according to the first data and the third data, wherein the second reference value reflects a data variation status between the first data and the third data; sending a fourth read command sequence which instructs a reading of the first physical unit based on a fourth read voltage level to obtain fourth data according to the first reference value and the second reference value; and decoding the fourth data by a decoding circuit.

A memory storage device including a connection interface unit, a rewritable non-volatile memory module and a memory control circuit unit is provided according to an exemplary embodiment of the disclosure. The connection interface unit is configured to connect a host system. The rewritable non-volatile memory module includes a plurality of physical units. The memory control circuit unit is coupled to the connection interface unit and the rewritable non-volatile memory module. The memory control circuit unit is configured to send a first read command sequence which instructs a reading of a first physical unit among the physical units based on a first read voltage level to obtain first data. The memory control circuit unit is further configured to send a second read command sequence which instructs a reading of the first physical unit based on a second read voltage level to obtain second data. The memory control circuit unit is further configured to send a third read command sequence which instructs a reading of the first physical unit based on a third read voltage level to obtain third data. The memory control circuit unit is further configured to obtain a first reference value according to the first data and the second data, wherein the first reference value reflects a data variation status between the first data and the second data. The memory control circuit unit is further configured to obtain a second reference value according to the first data and the third data, wherein the second reference value reflects a data variation status between the first data and the third data. The memory control circuit unit is further configured to send a fourth read command sequence which instructs a reading of the first physical unit based on a fourth read voltage level to obtain fourth data according to the first reference value and the second reference value. The memory control circuit unit is further configured to decode the fourth data.

A memory control circuit unit for controlling a rewritable non-volatile memory module including a plurality of physical units is provided according to an exemplary embodiment of the disclosure. The memory control circuit unit includes a host interface, a memory interface, a decoding circuit and a memory management circuit. The host interface is configured to couple to a host system. The memory interface is configured to couple to the rewritable non-volatile memory module. The memory management circuit is coupled to the host interface, the memory interface and the decoding circuit. The memory management circuit is configured to send a first read command sequence which instructs a reading of a first physical unit among the physical units based on a first read voltage level to obtain first data. The memory management circuit is further configured to send a second read command sequence which instructs a reading of the first physical unit based on a second read voltage level to obtain second data. The memory management circuit is further configured to send a third read command sequence which instructs a reading of the first physical unit based on a third read voltage level to obtain third data. The memory management circuit is further configured to obtain a first reference value according to the first data and the second data, wherein the first reference value reflects a data variation status between the first data and the second data. The memory management circuit is further configured to obtain a second reference value according to the first data and the third data, wherein the second reference value reflects a data variation status between the first data and the third data. The memory management circuit is further configured to send a fourth read command sequence which instructs a reading of the first physical unit based on a fourth read voltage level to obtain fourth data according to the first reference value and the second reference value. The decoding circuit is configured to decode the fourth data.

Based on the above, the first read voltage level, the second read voltage level, and the third read voltage level may be used to read the first physical unit to obtain first data, second data, and third data, respectively. The first reference value reflecting the data variation status between the first data and the second data, and the second reference value reflecting the data variation status between the first data and the third data may be obtained. According to the first reference value and the second reference value, the fourth read voltage level may be used to read the first physical unit to obtain the fourth data. Then, the decoding circuit may decode the fourth data. Therefore, even if the soft bit decoding mode is not entered, the decoding success rate of a decoding circuit may be effectively improved, thereby improving the data accessing performance of the memory storage device.

To make the aforementioned and other features of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and may be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
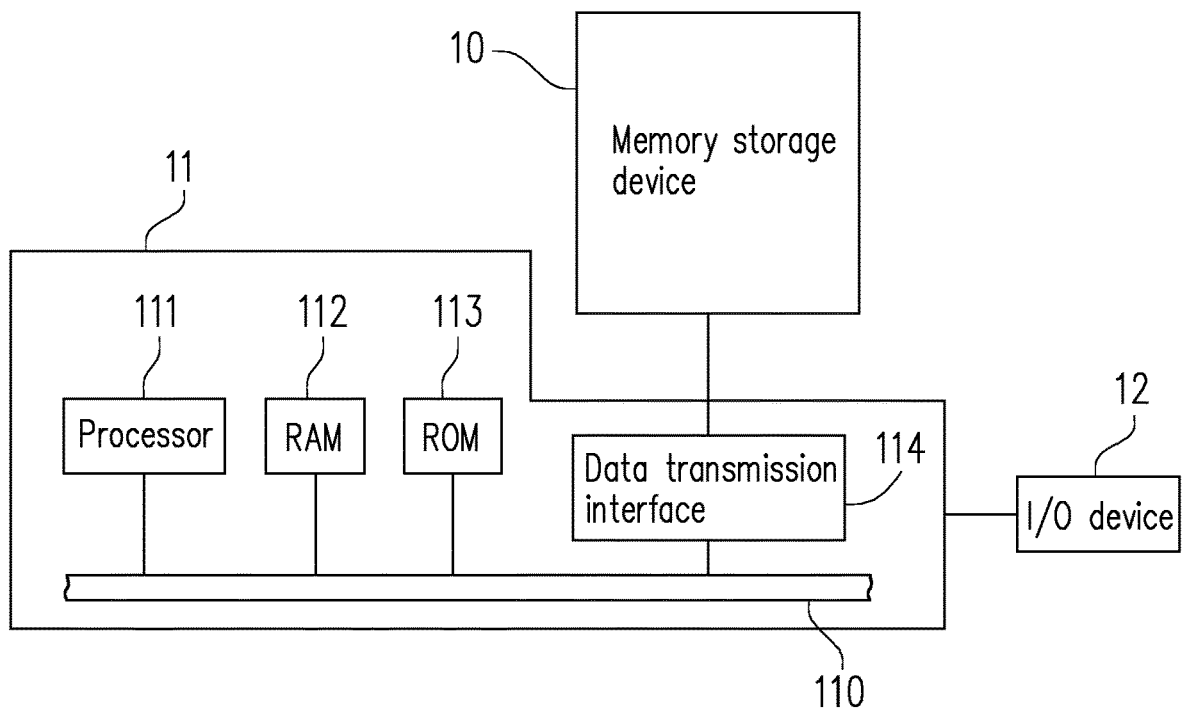
FIG. 1 is a schematic diagram of a host system, a memory storage device, and an input/output (I/O) device according to an exemplary embodiment of the disclosure.

Reference may now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (also referred to as a memory storage system) includes a rewritable non-volatile memory module and a controller (also referred to as a control circuit). The memory storage device is normally used together with a host system, allowing the host system to write data to the memory storage device or read data from the memory storage device.

Figure 2:
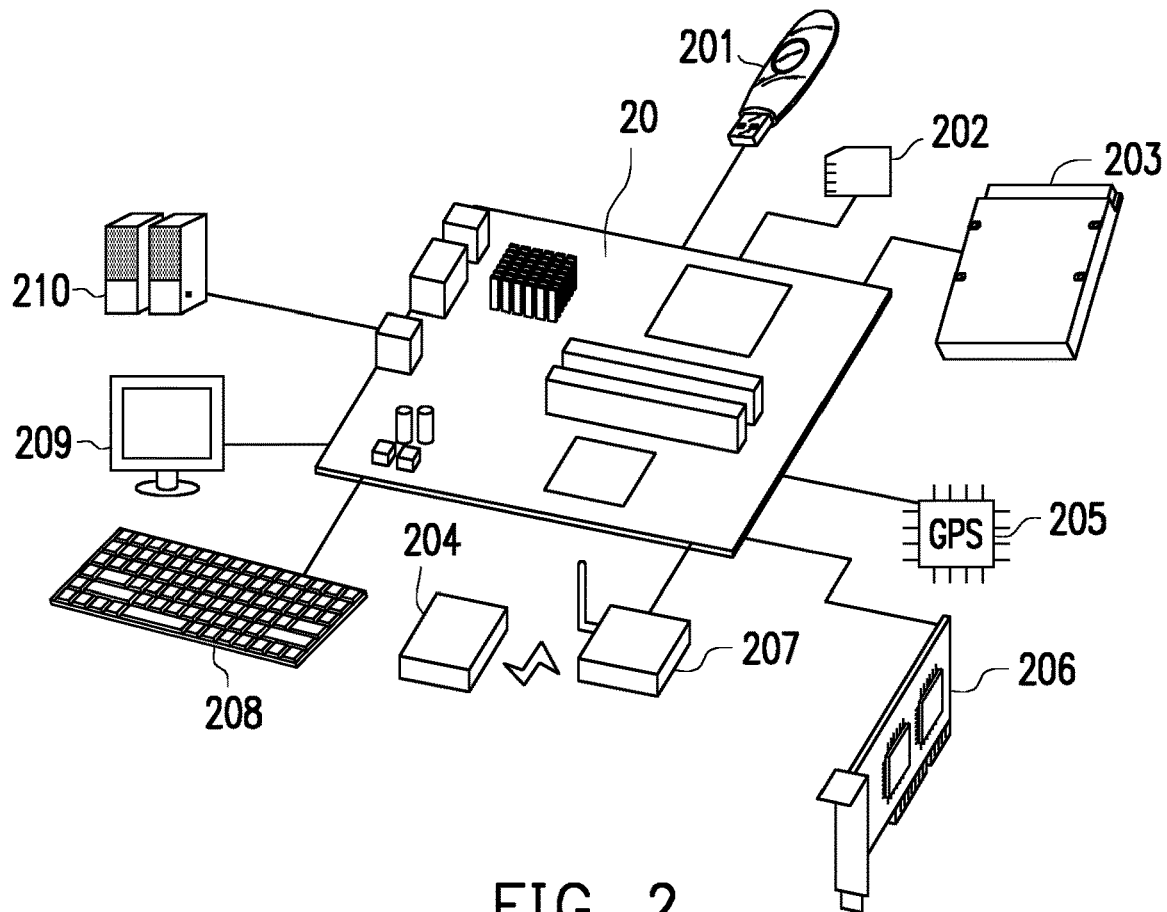
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2, a host system 11 normally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In the exemplary embodiment, the processor 111, the random access memory 112, the read-only memory 113, and the data transmission interface 114 may be disposed on a motherboard 20 of the host system 11. The number of data transmission interfaces 114 may be one or more. The motherboard 20 may be coupled to the memory storage device 10 via a wired or a wireless method through the data transmission interface 114. The memory storage device 10 may be, for example, a flash drive 201, a memory card 202, a Solid State Drive (SSD) 203, or a wireless memory storage device 204. The wireless memory storage device 204 may be, for example, a Near Field Communication (NFC) memory storage device, a wireless fidelity (WiFi) memory storage device, a Bluetooth memory storage device, a Bluetooth low energy (BLE) memory storage device (e.g. iBeacon), or other memory storage devices based on various types of wireless communication technologies. In addition, the motherboard 20 may also be coupled to a Global Positioning System (GPS) module 205, a network interface card 206, a wireless transmission device 207, a keyboard 208, a screen 209, a speaker 210, or other types of I/O devices through the system bus 110. For example, in an exemplary embodiment, the motherboard 20 may access the wireless memory storage device 204 through the wireless transmission device 207.

Figure 3:
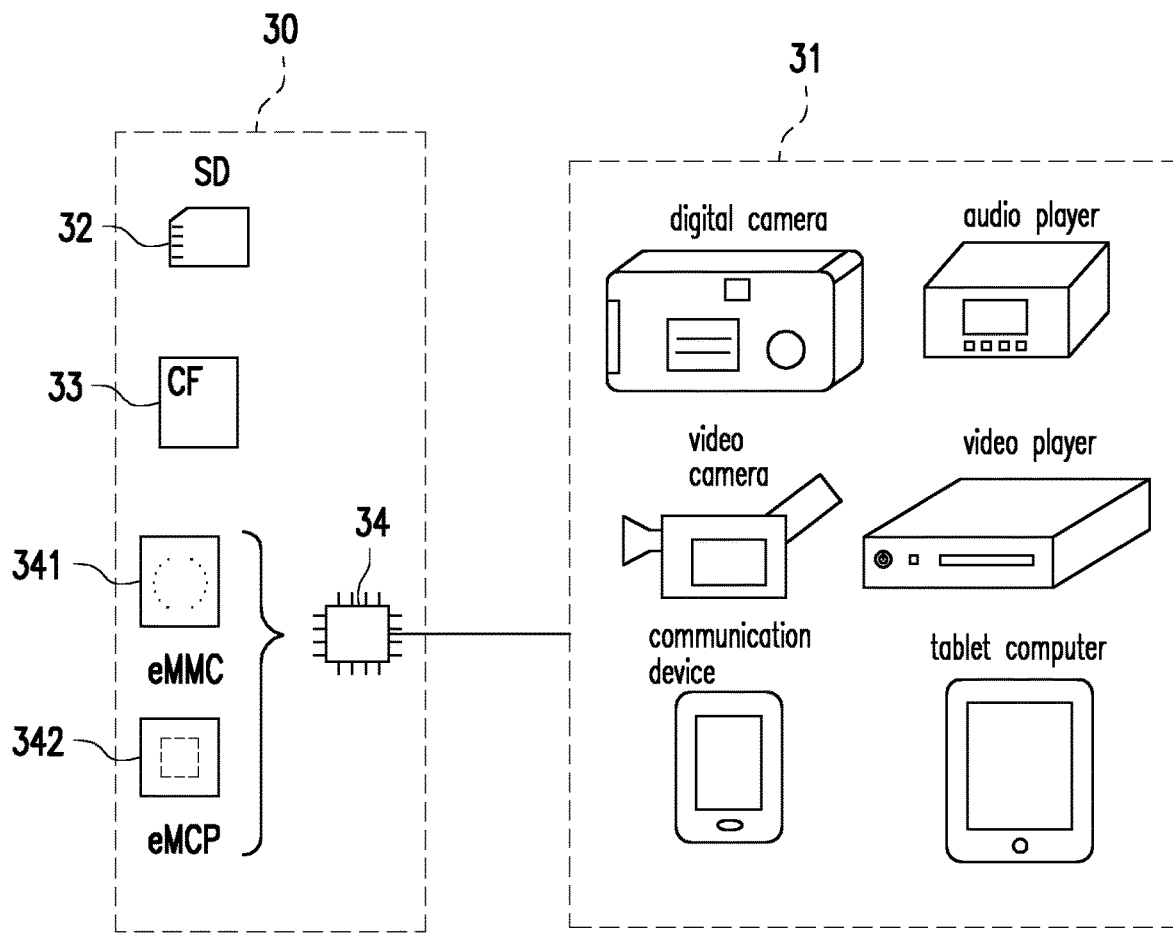
FIG. 3 is a schematic diagram of a host system and a memory storage device according to another exemplary embodiment of the disclosure.

In an exemplary embodiment, the host system mentioned may be any system that may substantially work with a memory storage device to store data. Although in the exemplary embodiments above, a computer system is used as the host system for illustration, FIG. 3 is a schematic diagram of a host system and a memory storage device according to another exemplary embodiment of the disclosure. Please refer to FIG. 3, in another exemplary embodiment, a host system 31 may also be a digital camera, a video camera, a communication device, an audio player, a video player, a tablet computer, or other systems. A memory storage device 30 may be a Secure Digital (SD) card 32, a Compact Flash (CF) card 33, an embedded storage device 34, or other types of non-volatile memory storage devices used by the host system 31. The embedded storage device 34 includes an embedded Multi Media Card (eMMC) 341, and/or an embedded Multi Chip Package (eMCP) storage device 342, or various types of embedded storage devices which directly couple a memory module onto a substrate of a host system.

Figure 4:
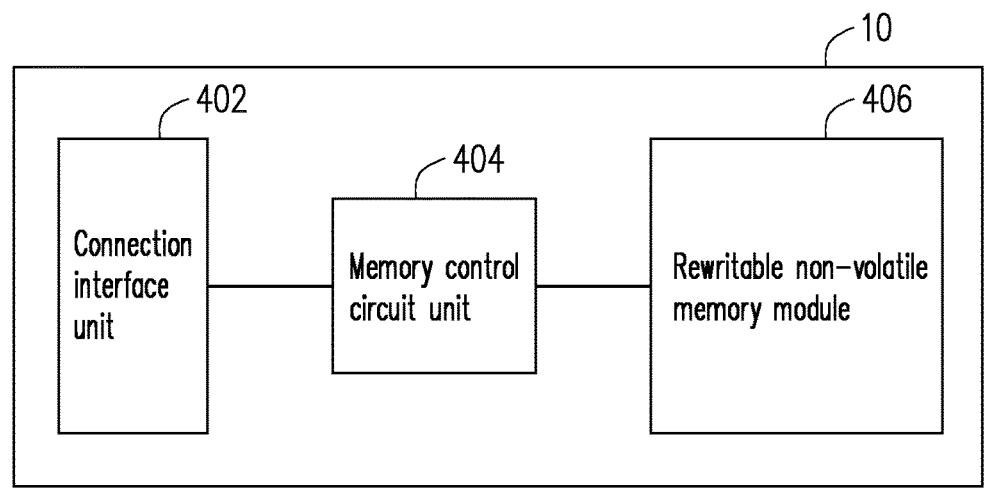
FIG. 4 is a functional block diagram of a memory storage device according to an exemplary embodiment of the disclosure.

FIG. 4 is a functional block diagram of a memory storage device according to an exemplary embodiment of the disclosure.

Please refer to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In the exemplary embodiment, the connection interface unit 402 is compatible with the Serial Advanced Technology Attachment (SATA) standard. However, it must be understood that the disclosure is not limited thereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged in one chip with the memory control circuit unit 404 or the connection interface unit 402 may be disposed outside a chip containing the memory control circuit unit 404.

The memory control circuit unit 404 is configured to perform multiple logic gates or control commands implemented using a hardware type or a firmware type and execute operations such as writing, reading, and erasing of data in the rewritable non-volatile memory module 406 according to the command of the host system 11.

The rewritable non-volatile memory module 406 is coupled to the memory control circuit unit 404 and is configured to store data written by the host system 11. The rewritable non-volatile memory module 406 may be a Single Level Cell (SLC) NAND flash memory module (i.e., a flash memory module which stores 1-bit in one memory cell), a Multi Level Cell (MLC) NAND flash memory module (i.e., a flash memory module which stores 2-bits in one memory cell), a Triple Level Cell (TLC) NAND flash memory module (i.e., a flash memory module which stores 3-bits in one memory cell), a Quad Level Cell (QLC) NAND flash memory module (i.e., a flash memory module which stores 4-bits in one memory cell), other flash memory modules, or other memory modules with the same characteristic.

Each memory cell of the rewritable non-volatile memory modules 406 stores one or more bits based on a change of voltage (also referred to as a threshold voltage hereinafter). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data into the memory cell" or "programming the memory cell". As the threshold voltage changes, each memory cell of the rewritable non-volatile memory module 406 has multiple storage states. Through applying a read voltage, the storage state to which a memory cell belongs may be determined, thereby obtaining one or more bits stored by the memory cell.

In the exemplary embodiment, the memory cells of the rewritable non-volatile memory module 406 constitute multiple physical programming units, and the physical programming units constitute multiple physical erasing units. Specifically, the memory cells on the same word line form one or more physical programming units. If each memory cell may store two bits or more than 2 bits, then the physical programming units on the same word line may at least be classified into a lower physical programming unit and an upper physical programming unit. For example, a Least Significant Bit (LSB) of a memory cell belongs to the lower physical programming unit while a Most Significant Bit (MSB) of a memory cell belongs to the upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the exemplary embodiment, the physical programming unit is the smallest unit of programming. That is, the physical programming unit is the smallest unit of write data. For example, the physical programming unit is a physical page or a physical sector. If the physical programming unit is a physical page, then the physical programming units normally include a data bit region and a redundancy bit region. The data bit region includes multiple physical sectors for storing user data while the redundancy bit region is for storing system data (e.g. management data such as error correction codes, etc.). In the exemplary embodiment, the data bit region contains 32 physical sectors, and the size of one physical sector is 512 bytes (B). However, in other exemplary embodiments, a data bit region may also contain 8, 16, a higher number, or a lower number of physical sectors, and the size of each physical sector may also be larger or smaller. On the other hand, the physical erasing unit is the smallest unit of erase. That is, each physical erasing unit includes the smallest number of memory cells erased together. For example, the physical erasing unit is a physical block.

Figure 5:
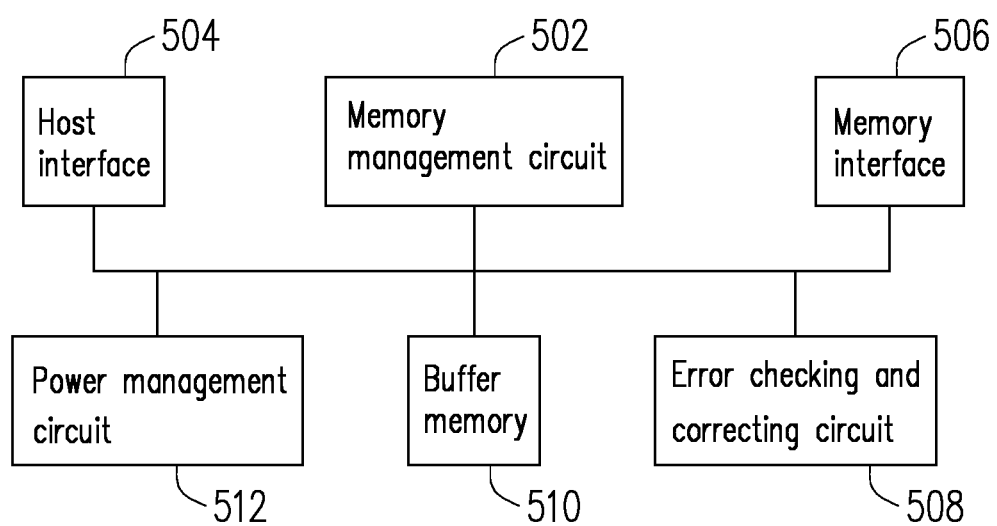
FIG. 5 is a functional block diagram of a memory control circuit unit according to an exemplary embodiment of the disclosure.

FIG. 5 is a functional block diagram of a memory control circuit unit according to an exemplary embodiment of the disclosure.

Please refer to FIG. 5, the memory control circuit unit 404 includes a memory management circuit 502, a host interface 504 and a memory interface 506.

The memory management circuit 502 is configured to control the overall operation of the memory control circuit unit 404. Specifically, the memory management circuit 502 has multiple control commands. When the memory storage device 10 operates, the control commands are performed to carry out operations such as writing, reading, and erasing of data. The illustration of operation of the memory management circuit 502 below may be equivalent to the illustration of operation of the memory control circuit unit 404.

In the exemplary embodiment, the control commands of the memory management circuit 502 are implemented using a firmware form. For example, the memory management circuit 502 has a microprocessor unit (not shown) and a read only memory (not shown), and the control commands are burnt into the read only memory. When the memory storage device 10 operates, the control commands are performed by the microprocessor unit to carry out operations such as writing, reading, and erasing of data.

In another exemplary embodiment, the control commands of the memory management circuit 502 may also be stored in a specific area of the rewritable non-volatile memory module 406 (e.g. a system area in the memory module dedicated to storage of system data) as a program code. In addition, the memory management circuit 502 has a microprocessor unit (not shown), a read only memory (not shown), and a random access memory (not shown). In particular, the read only memory has a boot code. When the memory control circuit unit 404 is enabled, the microprocessor unit first performs the boot code to load the control commands stored in the rewritable non-volatile memory module into the random access memory of the memory management circuit 502. Then, the microprocessor unit may run the control commands to carry out operations such as writing, reading, and erasing of data.

In addition, in another exemplary embodiment, the control commands of the memory management circuit 502 may also be implemented using a hardware form. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells of the rewritable non-volatile memory module 406 or a group thereof. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. The write command sequence, the read command sequence, and the erase command sequence may each include one or more program code or command code, and are for instructing the rewritable non-volatile memory module 406 to perform the corresponding write, read, erase, etc. operations. In an exemplary embodiment, the memory management circuit 502 may also issue other types of command sequences to the rewritable non-volatile memory module 406 to instruct performance of the corresponding operation.

The host interface 504 is coupled to the memory management circuit 502. The memory management circuit 502 may communicate with the host system 11 through the host interface 504. The host interface 504 is configured to receive and identify commands and data transmitted by the host system 11. For example, the commands and the data transmitted by the host system 11 are transmitted to the memory management circuit 502 through the host interface 504. Furthermore, the memory management circuit 502 may transmit data to the host system 11 through the host interface 504. In the exemplary embodiment, the host interface 504 is compatible with the SATA standard. However, it must be understood that the disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other standards suitable for data transmission.

The memory interface 506 is coupled to the memory management circuit 502 and is configured to access the rewritable non-volatile memory module 406. In other words, the data to be written to the rewritable non-volatile memory module 406 is converted to a format acceptable to the rewritable non-volatile memory module 406 via the memory interface 506. Specifically, if the memory management circuit 502 is to access the rewritable non-volatile memory module 406, the memory interface 506 may transmit a corresponding command sequence. For example, the command sequences may include a write command sequence instructing a writing of data, a read command sequence instructing a reading of data, an erase command sequence instructing an erasing of data, and corresponding command sequences for instructing various types of memory operations (e.g. changing read voltage level, performing garbage collection operation, etc.). The command sequences are generated, for example, by the memory management circuit 502 and transmitted to the rewritable non-volatile memory module 406 through the memory interface 506. The command sequences may include one or more signals, or data on the system bus. The signals or data may include command codes or program codes. For example, in the read command sequence, information such as a read identification code, a memory address, etc. are included.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and is configured to perform error checking and correcting operations to ensure correctness of data. Specifically, when the memory management circuit 502 receives a write command from the host system 11, the error checking and correcting circuit 508 may generate an error correcting code (ECC) and/or an error detecting code (EDC) for the data corresponding to the write command. The memory management circuit 502 may write the data corresponding to the write command and the corresponding error correcting code and/or error detecting code into the rewritable non-volatile memory module 406. Then, when the memory management circuit 502 reads data from the rewritable non-volatile memory module 406, the error correcting code and/or the error detecting code corresponding to the data are read simultaneously. The error checking and correcting circuit 508 may perform an error checking and correcting operation to the read data based on the error correcting code and/or error detecting code.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, the memory control circuit unit 404 of FIG. 4 is also referred to as a flash memory controller configured to control the flash memory module, and/or the memory management circuit 502 of FIG. 5 is also referred to as a flash memory management circuit.

Figure 6A:
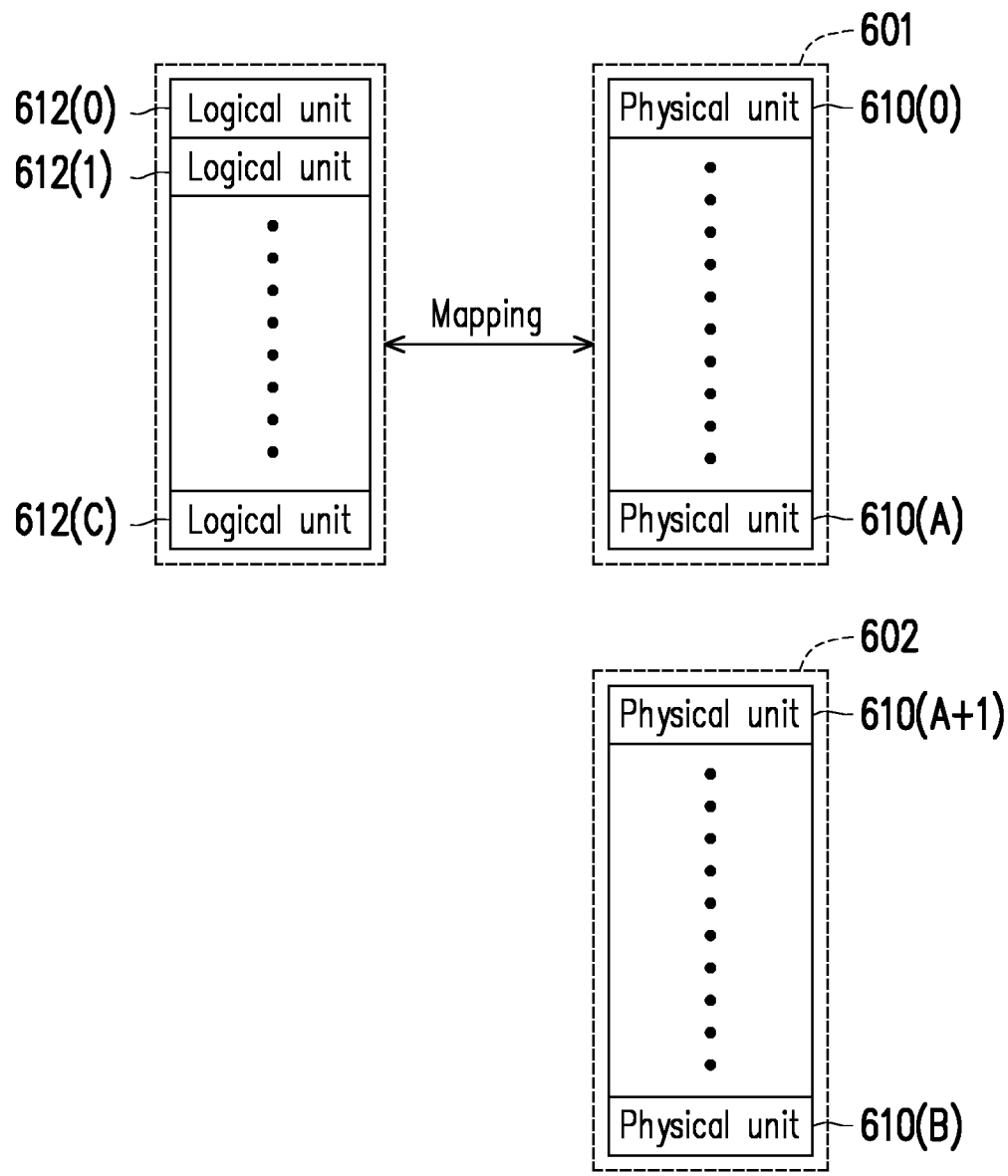
FIG. 6A is a schematic diagram of managing a rewritable non-volatile memory module according to an exemplary embodiment of the disclosure.

FIG. 6A is a schematic diagram of managing a rewritable non-volatile memory module according to an exemplary embodiment of the disclosure.

Please refer to FIG. 6A, the memory management circuit 502 may logically group the physical units 610(0)-610(B) of the rewritable non-volatile memory module 406 into a storage area 601 and a replacement area 602. The physical units 610(0)-610(A) in the storage area 601 are configured to store data, and the physical units 610(A+1)-610(B) in the replacement area 602 are configured to replace damaged physical units in the storage area 601. For example, if data read from one specific physical unit includes too many errors and these errors cannot be corrected, the specific physical unit is regarded as a damaged physical unit. It is noted that, if there is no available physical erasing unit in the replacement area 602, the memory management circuit 502 may declare the memory storage device 10 as in a write protect state so data may no longer be written thereto.

In the exemplary embodiment, one physical unit is referred to as one physical erasing unit. However, in another exemplary embodiment, one physical unit may also refer to one physical address, one physical programming unit or a composition of a plurality of continuous or discontinuous physical addresses. The memory management circuit 502 may assign logical units 612(0)-612(C) for mapping to the physical units 610(0)-610(A) in the storage area 601. In the exemplary embodiment, one logical unit may refer to one logical address. However, in another exemplary embodiment, one logical unit may also refer to one logical programming unit, one logical erasing unit or a composition of a plurality of continuous or discontinuous logical addresses. In addition, one of the logical units 612(0)-612(C) may be mapped to one or more physical units.

The memory management circuit 502 may record a mapping relation (also referred to as a logical-physical address mapping relation) between the logical units and the physical units into at least one logical-physical address mapping table. When the host system 11 intends to read data from the memory storage device 10 or write data into the memory storage device 10, the memory management circuit 502 may perform a data accessing operation on the memory storage device 10 according to the logical-physical address mapping table.

It is noted that in the following description, some terms may be replaced with corresponding abbreviations for ease of reading (see Table 1).

TABLE 1

| | |
|---|---|
| rewritable non-volatile memory module | RNVM module |
| memory management circuit | MMC |
| error checking and correcting circuit | ECCC |
| read voltage level | RVL |

After the memory storage device 10 of FIG. 1 is used for a period of time, the memory cells in the memory storage device 10 may be aged and/or be weared. The threshold voltages of these memory cells may be shifted in response to aging and/or wear of these memory cells. The threshold voltages of the memory cells being shifted, means changes of the threshold voltages, such as shifting from one voltage position to another voltage position. The shift of threshold voltages of the memory cells may affect the correctness of the data read from the memory cell. For example, it is assumed that a threshold voltage of a previously programmed memory cell is higher than a preset RVL. However, due to aging and/or wearing, the threshold voltage of this memory cell may be shifted to a voltage position lower than the preset RVL. Therefore, if this preset RVL is continuously used to read this memory cell, error bits may be read from this memory cell.

In an example embodiment, the ECCC 508 may include one or more decoding circuits. This decoding circuit may be used to decode data read from the RNVM module 406. For example, the decoding circuit may attempt to correct some or all of the error bits in the data read from the aged and/or weared memory cells. For example, in an exemplary embodiment, the ECCC 508 may encode and decode data by using a low density parity check code (LDPC code). However, in another exemplary embodiment, the ECCC 508 may also support a BCH code, a convolutional code, a turbo code, etc., which is not limited by the present disclosure. It is noted that in some cases, if the offset/shift of the RVL for reading the memory cell is too large, the decoding capability and/or the decoding success rate of the decoding circuit may be greatly reduced.

In an exemplary embodiment, after reading data from a specific physical unit of the RNVM module 406, the ECCC 508 may decode the read data based on a specific decoding mode (also known as a first decoding mode). After determining that the first decoding mode cannot successfully decode the read data, the ECCC 508 may decode the read data based on another decoding mode (also known as a second decoding mode). Moreover, in an exemplary embodiment, after reading data from a specific physical unit of the RNVM module 406, the ECCC 508 may also decode the data directly based on the second decoding mode (i.e., skipping the first decoding mode), the disclosure is not limited thereto. In an exemplary embodiment, the first decoding mode is also referred to as a hard bit decoding mode or a retry mode, and the second decoding mode is also referred to as a soft bit decoding mode.

In the first decoding mode, the MMC 502 may send at least one read command sequence to the RNVM module 406. The read command sequence may instruct the RNVM module 406 to use a specific RVL to read a memory cell in a specific physical unit (also known as a first physical unit). The ECCC 508 may then decode the read data. If the decoding is successful, the successfully decoded data may be output. If the decoding fails, the MMC 502 may adjust the RVL to be used and instruct the RNVM module 406 to read the first physical unit again by using the adjusted RVL. The ECCC 508 may then decode the read data again. The MMC 502 and the ECCC 508 may repeat the above operations until the decoding is successful or a retry count reaches a preset value. For example, in the first decoding mode, the retry count may be updated (e.g., increased by one) each time the RVL is adjusted. If the retry count reaches a preset value, such as continuously reading the same physical unit by using 60 different RVLs, the MMC 502 may instruct the ECCC 508 to enter the second decoding mode.

In the second decoding mode, the MMC 502 may send at least one read command sequence to the RNVM module 406. The read command sequence may instructs the RNVM module 406 to use multiple RVLs to read the memory cell in the first physical unit. It is noted that, in the second decoding mode, multiple RVLs may be used to read one single memory cell to obtain multiple bits (also known as verification bits). One of these verification bits is also called as a hard bit, and the remaining bits are also called as soft bits. For example, if five RVLs are used to continuously read a specific memory cell and thereby obtaining five verification bits, then these five verification bits may contain one hard bit and four soft bits. In an exemplary embodiment, these four soft bits may also be reduced to two soft bits by performing a logical operation. In addition, the present disclosure does not limit the number of the RVLs for reading a certain memory cell in the second decoding mode, the number of hard bits read from a certain memory cell, and/or the number of soft bits read from a certain memory cell. The ECCC 508 may then decode the read data.

It is noted that, in the second decoding mode, the MMC 502 may update reliability information according to the soft bits. For example, comparing to the default reliability information, the updated reliability information may be more consistent with the current aging and/or wear status of the memory cell. According to the updated reliability information, the ECCC 508 has a higher probability for successfully decoding the read data.

In an example embodiment, the reliability information may include a log likelihood ratio (LLR). The LLR may reflect the probability that the data read from a certain memory cell is a bit of "0" and/or a bit of "1". In an exemplary embodiment, the reliability information may be obtained by looking up a table. For example, at least one reliability information table provided by the vendor of the memory module may be stored in the RNVM module 406. The MMC 502 may query the reliability information table based on the obtained soft bits to obtain the reliability information used for decoding. In an exemplary embodiment, the reliability information may be obtained by an instant calculation. For example, the MMC 502 may estimate the total number of memory cells with threshold voltage belongs to a certain voltage range based on the obtained soft bits. The MMC 502 may dynamically calculate the reliability information corresponding to the memory cells based on the total number. In an exemplary embodiment, the reliability information dynamically obtained according to the total number may be more consistent with the current aging and/or wear status of the memory cell. Therefore, the use of the dynamically obtained reliability information may also improve the decoding success rate of the ECCC 508.

In the first decoding mode, the MMC 502 may dynamically determine the RVL for the next use based on the data obtained by reading the first physical unit several times. In an example embodiment, the MMC 502 may obtain the RVL for the next use in the first decoding mode without using a retry table. Comparing to the RVL for the next use being determined according to the retry table in the traditional retry mode, said dynamically determined RVL may be more consistent with the currently aging and/or wear status of the memory cell in the first physical unit, thereby improving the decoding success rate of the data read by using the RVL.

Specifically, in the first decoding mode, the MMC 502 may send a read command sequence (also referred to as a first read command sequence) to instruct a reading of memory cells in the first physical unit based on a specific RVL (also referred to as a first RVL) to obtain data (also referred to as first data). The ECCC 508 may decode the first data. If the decoding is successful (i.e., the errors in the data are all corrected), the ECCC 508 may output the successfully decoded data. If the decoding of the first data fails (i.e., the errors in the data are not all corrected), the MMC 502 may send a read command sequence (also referred to as a second read command sequence) to instruct a reading of the memory cells in the first physical unit based on a specific RVL (also referred to as a second RVL) to obtain data (also referred to as second data). The ECCC 508 may decode the second data. If the decoding is successful, the ECCC 508 may output the successfully decoded data. If the decoding of the second data fails, the MMC 502 may send a read command sequence (also referred to as a third read command sequence) to instruct a reading of the memory cells in the first physical unit based on a specific RVL (also referred to as a third RVL) to obtain data (also referred to as third data).

The ECCC 508 may decode the third data. If the decoding is successful, the decoding circuit may output the successfully decoded data. If the decoding of the third data fails, the MMC 502 may obtain a reference value (also known as first reference value) based on the first data and the second data. The first reference value reflects a data variation status (also referred to as a first data variation status) between the first data and the second data. In addition, the MMC 502 may obtain another reference value (also known as second reference value) based on the first data and the third data. The second reference value reflects a data variation status (also referred to as a second data variation status) between the first data and the third data. The MMC 502 may automatically send a read command sequence (also referred to as a fourth read command sequence) to instruct a reading of the memory cells in the first physical unit based on a specific RVL (also referred to as a fourth RVL) to obtain data (also referred to as fourth data) according to the first reference value and the second reference value. Then, the ECCC 508 may decode the fourth data.

In other words, the fourth RVL is automatically determined based on the first data variation status and the second data variation status. The fourth RVL matches the current aging and/or wear status of the memory cells in the first physical unit. Therefore, when repeatedly reading the same physical unit four times or more than four times in the first decoding mode, the number of error bits in the read data has a high probability to be greatly reduced, thereby improving the decoding performance and/or the decoding success rate of the ECCC 508. In the following, a plurality of exemplary embodiments will be described to explain how to determine the RVL in the first decoding mode that more closely matches the aging and/or wear status of the memory cells in the first physical unit.

Figure 6B:
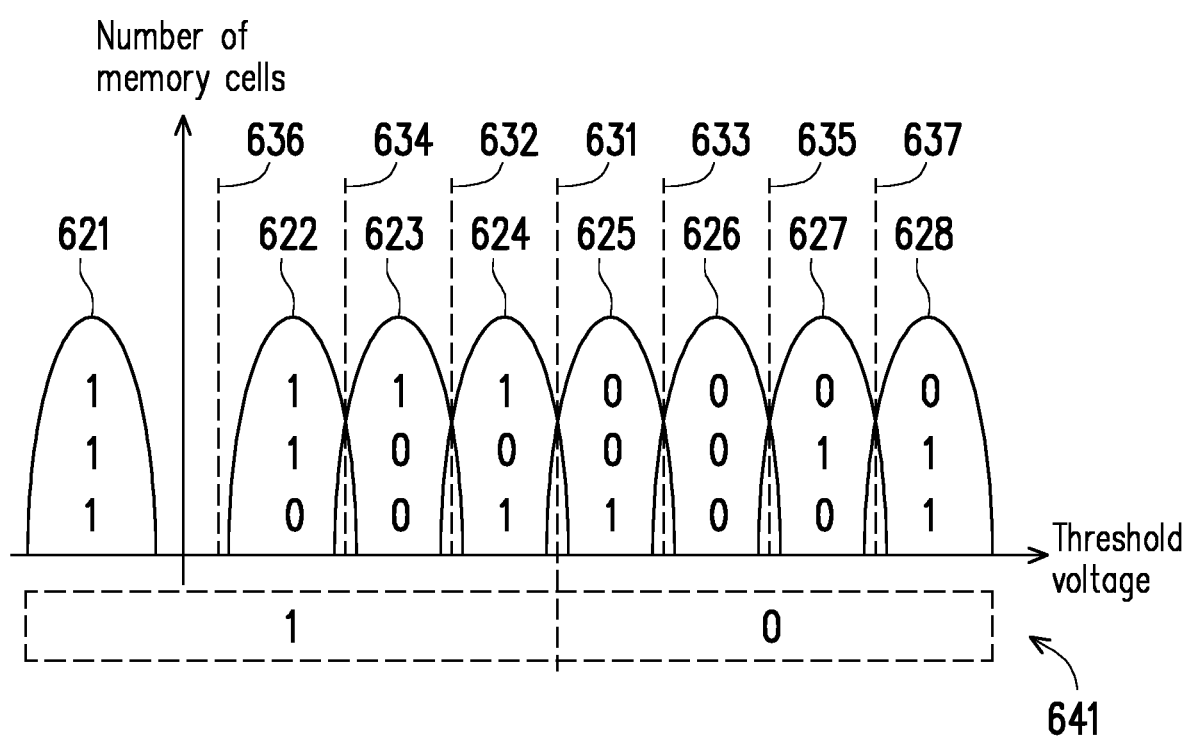
FIG. 6B is a schematic diagram of determining a read voltage level according to an exemplary embodiment of the disclosure.

FIG. 6B is a schematic diagram of determining a RVL according to an exemplary embodiment of the disclosure.

Referring to FIG. 6B, in the present exemplary embodiment, it is assumed that the RNVM module 406 includes a TLC NAND flash memory module. Therefore, a threshold voltage distribution of the memory cells in the first physical unit contains states 621-628. The states 621-628 correspond to the bits "111", "110", "100", "101", "001", "000", "010", and "011", respectively. In other words, the memory cells with threshold voltages belonging to the states 621 to 628 are configured to store the bits "111", "110", "100", "101", "001", "000", "010", and "011", respectively. It is noted that in another exemplary embodiment, the threshold voltage distribution of the memory cells in the first physical unit may also include more or less states and/or each state may correspond to different bits, and the present disclosure is not limited thereto.

In the present exemplary embodiment, the MMC 502 may instruct a reading of the first physical unit based on a RVL 631 to obtain initial data 641. The initial data 641 may reflect whether each memory cell in the first physical unit is turned on by the RVL 631. For example, if a threshold voltage of a specific memory cell is lower than the RVL 631, the memory cell may be turned on by the RVL 631, and the MMC 502 may obtain the bit of "1" in the initial data 641. Alternatively, if a threshold voltage of a specific memory cell is not lower than the RVL 631, the memory cell may not be turned on by the RVL 631, and the MMC 502 may obtain the bit of "0" in the initial data 641.

In an exemplary embodiment, the initial data 641 obtained by applying the RVL 631 includes lower page data. For example, the lower page data includes a LSB read from a certain memory cell. Taking the bits of "110" corresponding to the state 622 in FIG. 6B as an example, the uppermost bit of "1" belongs to the lower page data. In an example embodiment, the MMC 502 may correct the RVL 631 based on the initial data 641, such as increasing or decreasing the RVL 631. In an exemplary embodiment, the operation of correcting the RVL 631 based on the initial data 641 is also referred to as a coarse tuning operation of the RVL 631. The coarse tuning operation may attempt to roughly correct the RVL 631 to reduce the error bits in the read initial data 641 (i.e., the lower page data).

In an example embodiment, the MMC 502 may count a total number of bits "1" (and/or bits "0") in the initial data 641 and adjust the RVL 631 based on the total number. For example, the MMC 502 may compare the total number to a default value. The MMC 502 may correct the RVL 631 based on the comparison result. For example, the default value may be equal to one-half the total number of all memory cells in the first physical unit. Assuming the first physical unit contains 512 memory cells, the default value may be 256. If the counted total number of bits "1" is greater than 256 (or the total number of bits "0" is less than 256), the MMC 502 may decrease the RVL 631. Alternatively, if the counted total number of bits "1" is less than 256 (or the total number of bit "0"s is greater than 256), the MMC 502 may increase the RVL 631.

In an exemplary embodiment, in the initial data 641 obtained by reading the first physical unit by using the corrected RVL 631, the total number of bits "1" may be the same or substantially the same as the total number of bits "0". Here, substantially the same means that an error value may be allowed to exist. For example, if a difference between the total number of bits "1" and the total number of bits "0" is less than this error value, it may be determined that the total number of bits "1" is substantially the same as the total number of bits "0".

In an exemplary embodiment, the MMC 502 may obtain the remaining RVLs 632-637 based on the initial data 641 and the RVL 631. For example, after the RVL 631 is corrected based on the initial data 641, the MMC 502 may obtain the RVLs 632-637 based on the corrected RVL 631. In an exemplary embodiment, the data obtained by applying the RVLs 632-637 includes upper page data and ultra page data. For example, the upper page data includes a center significant bit (CSB) read from a certain memory cell, and the ultra page data includes a MSB read from a certain memory cell. Taking the bits "110" corresponding to the state 622 in FIG. 6B as an example, the middle bit "1" belongs to the upper page data, and the lowermost bit "0" belongs to the ultra page data.

In an exemplary embodiment, the MMC 502 may obtain the RVLs 633, 635, and 637 according to the corrected RVL 631 plus different voltage gaps and obtain the RVLs 632, 634 and 636 according to the corrected RVL 631 which subtracts different voltage gaps. The voltage gap used to obtain the RVLs 632~637 may be recorded in a table and obtained by looking up the table. In other words, in an exemplary embodiment of FIG. 6B, the RVL between any two adjacent states may be roughly determined. It is noted that, in another exemplary embodiment, the coarse tuning operation of the RVL 631 may not be performed, and the RVLs 632-637 may be obtained according to the uncorrected RVL 631, which is not limited by the present disclosure. In the following example embodiments, at least one of the RVLs 631-637 may be further adjusted.

Figure 7A:
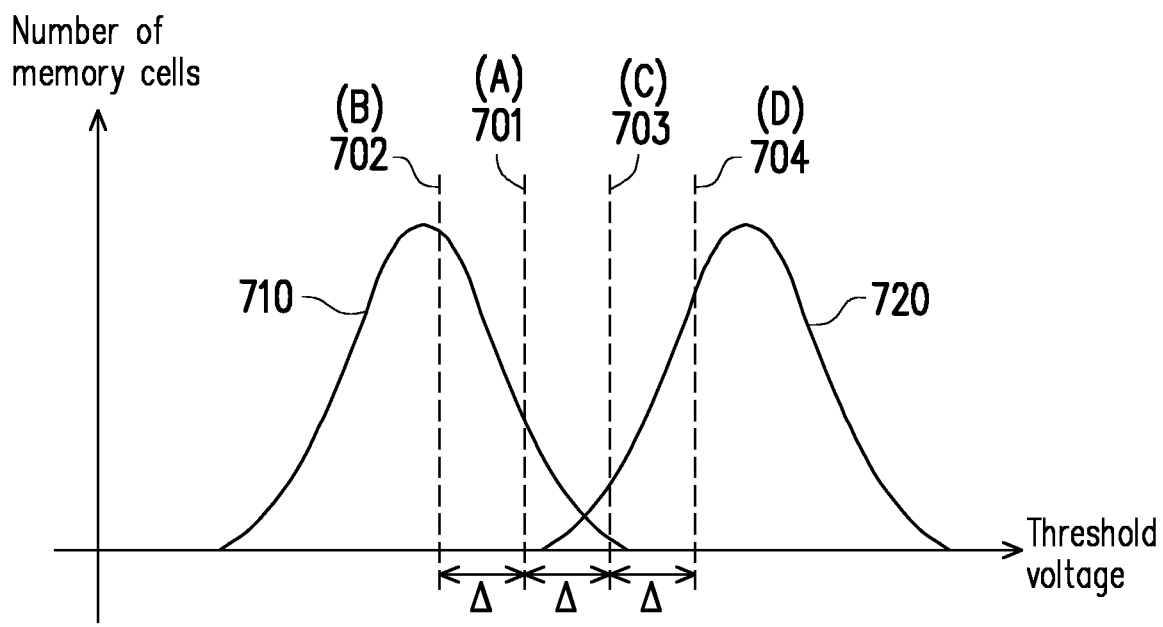
FIG. 7A to FIG. 7C are schematic diagrams of adjusting a read voltage level in a first decoding mode according to an exemplary embodiment of the disclosure.
Figure 7B:
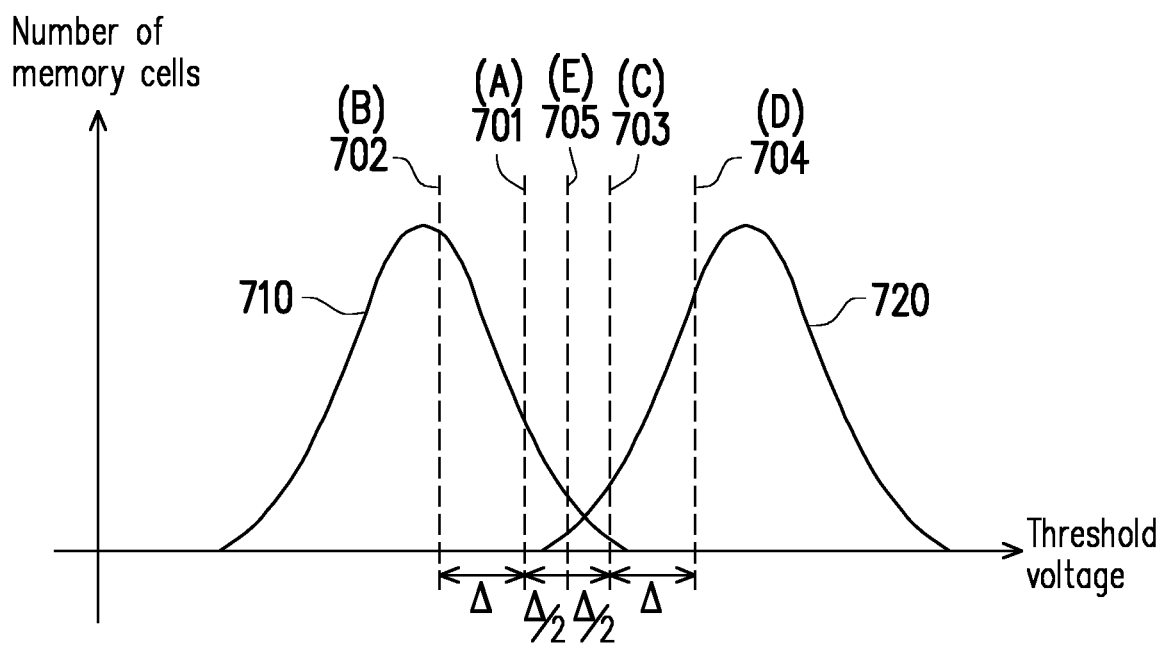
Figure 7C:
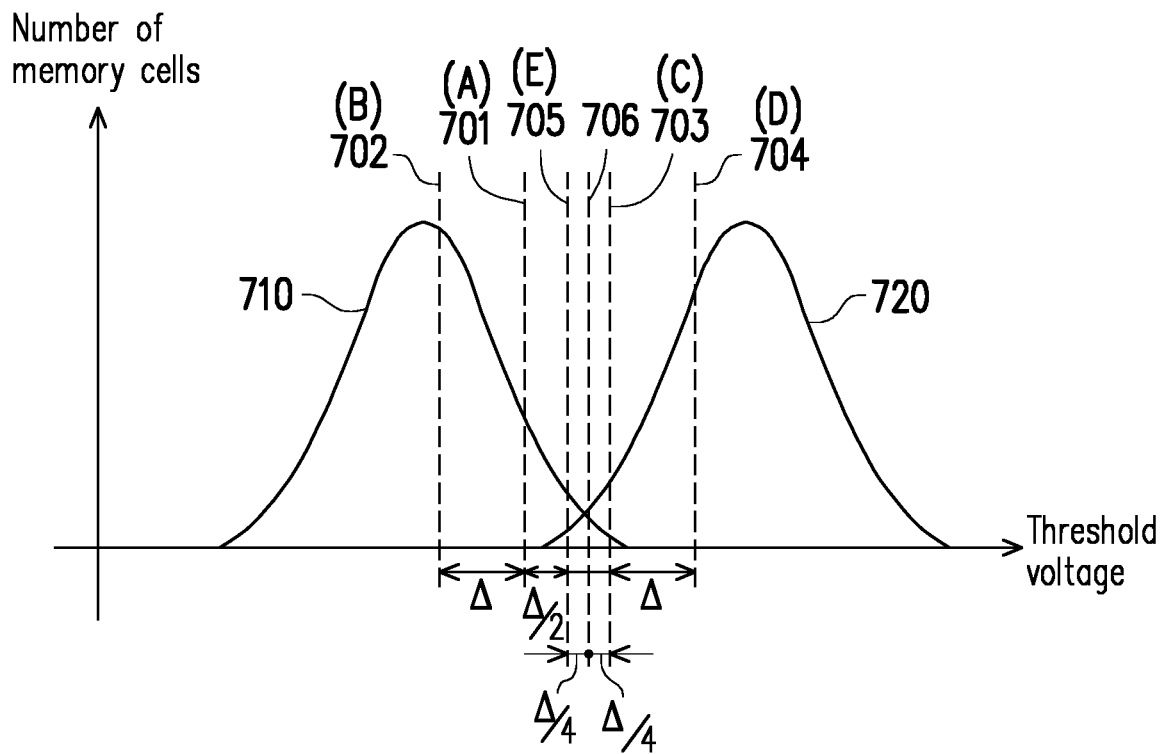

FIG. 7A to FIG. 7C are schematic diagrams of adjusting a RVL in a first decoding mode according to an exemplary embodiment of the disclosure.

Referring to FIG. 7A, in the present exemplary embodiment, it is assumed that a threshold voltage distribution of the memory cells in the first physical unit includes states 710 and 720. The states 710 and 720 may represent any two adjacent states of states 621-628 of FIG. 6B, and the present disclosure does not limit the total number of states included in the threshold voltage distribution of the memory cells in the first physical unit.

In the first decoding mode, the MMC 502 may instruct a reading of the first physical unit based on a RVL 701 to obtain data A. The RVL 701 may be a RVL between any two states in FIG. 6B. For example, assuming that the states 710 and 720 represent the states 622 and 623, the RVL 701 may represent the RVL 634; alternatively, assuming that the states 710 and 720 represent the states 623 and 624, the RVL 701 may represent the RVL 632, and so on.

The data A may reflect a conduction state of the memory cells in the first physical unit in response to the RVL 701. The ECCC 508 may decode the data A. If the decoding of the data A is successful, the decoded data A may be output. If the decoding of the data A is failed, the MMC 502 may instruct a reading of the first physical unit based on a RVL 702 to obtain data B. For example, the data B may reflect a conduction state of the memory cells in the first physical unit in response to the RVL 702. The ECCC 508 may decode the data B. If the decoding of the data B is successful, the decoded data B may be output. If the decoding of the data B is failed, the MMC 502 may instruct a reading of the first physical unit based on a RVL 703 to obtain data C. For example, the data C may reflect a conduction state of the memory cells in the first physical unit in response to the RVL 703. The ECCC 508 may decode the data C. If the decoding of the data C is successful, the decoded data C may be output.

In the present exemplary embodiment, a voltage value of the RVL 701 is higher than a voltage value of the RVL 702, and a voltage value of the RVL 703 is higher than the voltage value of the RVL 701. The voltage gap between the voltage value of the RVL 701 and the voltage value of the RVL 702 may be Δ. The voltage gap between the voltage value of the RVL 701 and the voltage value of the RVL 703 may also be Δ. However, in another exemplary embodiment, the voltage value of the RVL 702 and the voltage value of the RVL 703 may also be exchanged such that the voltage value of the RVL 702 may be higher than the voltage value of the RVL 703.

In the present exemplary embodiment, the decoding of the data C is failed. Therefore, the MMC 502 may obtain a reference value R_AB according to the data A and the data B. The reference value R_AB reflects a data variation status between the data A and the data B. The data variation status between the data A and the data B is related to the change in the conduction state of the memory cells. For example, the reference value R_AB may reflect the total number of memory cells in which the conduction state is changed in the first physical unit in response to the RVLs 701 and 702. The conduction state being changed includes a change from conduction (e.g., turned on) to non-conduction (e.g., not turned on) and a change from non-conduction to conduction. For example, assuming that the conduction states of 20 memory cells in the first physical unit are changed in response to the applied RVLs 701 and 702, the reference value R_AB may correspond to the value of 20.

In an example embodiment, the MMC 502 may perform a logical operation on the data A and the data B to obtain the reference value R_AB. For example, the logical operation may include an exclusive or (XOR) operation. For example, assuming that the data A includes a data sequence SA and the data B includes a data sequence SB. The bit "1" in the data sequence SA indicates that a certain memory cell may be turned on by the RVL 701. The bit "1" in the data sequence SB indicates that a certain memory cell may be turned on by the RVL 702. After performing the XOR operation on the data sequence SA and the data sequence SB, a logical sequence may be obtained. The bit "1" in this logical sequence reflects the change in the conduction state of a certain memory cell. The MMC 502 may count the total number of bits "1" in this logical sequence to obtain the reference value R_AB. For example, the reference value R_AB may reflect the change in the conduction state of 20 memory cells.

On the other hand, the MMC 502 may obtain a reference value R_AC based on the data A and the data C. The reference value R_AC reflects a data variation status between the data A and the data C. The data variation status between the data A and the data C is also related to the change in the conduction state of the memory cells. For example, the reference value R_AC may reflect the total number of memory cells in which the conduction state is changed in the first physical unit in response to the RVLs 701 and 703. For example, assuming that a conduction states of 10 memory cells in the first physical unit are changed in response to the applied RVLs 701 and 703, the reference value R_AC may correspond to the value of 10. The reference value R_AC may also be obtained by performing the above logical operations on the data A and the data C.

The MMC 502 may determine a RVL 704 based on the reference values R_AB and R_AC. For example, the MMC 502 may determine the RVL 704 based on a numerical relationship between the reference values R_AB and R_AC. For example, in the present exemplary embodiment, the MMC 502 determines the RVL 704 in response to a numerical relationship indicating that the reference value R_AC is less than reference value R_AB. The voltage value of the RVL 704 is higher than the voltage value of the RVL 703. For example, a voltage gap Δ may be present between the voltage value of the RVL 703 and the voltage value of the RVL 704. The MMC 502 may instruct a reading of the first physical unit based on the RVL 704 according to the reference values R_AB and R_AC to obtain the data D. For example, the data D may reflect a conduction state of the memory cells in the first physical unit in response to the RVL 704. The ECCC 508 may decode the data D. If the decoding of the data D is successful, the decoded data D may be output.

In the present exemplary embodiment, the decoding of the data D is failed. Therefore, the MMC 502 may obtain a reference value R_CD according to the data C and the data D. The reference value R_CD may reflect a data variation status between the data C and the data D. The data variation status between the data C and the data D is also related to the change in the conduction state of the memory cells. For example, the reference value R_CD may reflect the total number of memory cells in which the conduction state is changed in the first physical unit in response to the RVLs 703 and 704. The reference value R_CD may also be obtained by performing the above logical operations on the data C and the data D.

Referring to FIG. 7B, the MMC 502 may determine a RVL 705 according to the reference values R_AC and R_CD. For example, the MMC 502 may determine the RVL 705 based on a numerical relationship between the reference values R_AC and R_CD. For example, in the present exemplary embodiment, the MMC 502 determines the RVL 705 in response to a numerical relationship indicating that the reference value R_AC is less than the reference value R_CD. The voltage value of RVL 705 is located between the voltage value of the RVL 701 and the voltage value of the RVL 703. For example, a voltage gap between the voltage value of the RVL 705 and the voltage value of the RVL 701 may be Δ/2. A voltage gap between the voltage value of the RVL 705 and the voltage value of the RVL 703 may also be Δ/2. The MMC 502 may instruct a reading of the first physical unit based on the RVL 705 according to the reference values R_AC and R_CD to obtain data E. For example, the data E may reflect a conduction state of the memory cells in the first physical unit in response to the RVL 705. The ECCC 508 may decode the data E. If the decoding of the data E is successful, the decoded data E may be output.

In the present exemplary embodiment, the decoding of the data E is failed. Therefore, the MMC 502 may obtain a reference value R_AE based on the data A and the data E. The reference value R_AE reflects a data variation status between the data A and the data E. The reference value R_AE may also reflect the total number of memory cells in which the conduction state is changed in the first physical unit in response to the RVLs 701 and 705. The reference value R_AE may be obtained by performing the above logical operations on the data A and the data E. In addition, the MMC 502 may obtain the reference value R_EC according to the data E and the data C. The reference value R_EC reflects a data variation status between the data E and the data C. The reference value R_EC may reflect the total number of memory cells in which the conduction state is changed in the first physical unit in response to the RVLs 705 and 703. The reference value R_EC may be obtained by performing the above logical operations on the data E and the data C. Alternatively, the MMC 502 may obtain the reference value R_EC according to the reference values R_AC and R_AE. For example, the MMC 502 may subtract the reference value R_AE from the reference value R_AC to obtain the reference value R_EC.

Referring to FIG. 7C, the MMC 502 may determine a RVL 706 according to the reference values R_AE and R_EC. For example, the MMC 502 may determine the RVL 706 based on a numerical relationship between the reference values R_AE and R_EC. For example, in the present exemplary embodiment, the MMC 502 determines the RVL 706 in response to a numerical relationship indicating that the reference value R_EC is less than the reference value R_AE. The voltage value of the RVL 706 is between the voltage value of the RVL 705 and the voltage value of the RVL 703. For example, a voltage gap between the voltage value of the RVL 705 and the voltage value of the RVL 706 may be Δ/4. A voltage gap between the voltage value of the RVL 706 and the voltage value of the RVL 703 may also be Δ/4. The MMC 502 may instruct a reading of the first physical unit based on the RVL 706 according to the reference values R_AE and the R_EC. The ECCC 508 may continue to perform decoding operations in the first decoding mode.

Comparing to the traditional reading of retry table for determining the RVL for the next use, the RVLs 705 and 706 used in FIG. 7B and FIG. 7C have a higher probability of obtaining the read data with higher reliability. Thereby, the decoding performance and/or the decoding success rate of the ECCC 508 may be improved.

Figure 8A:
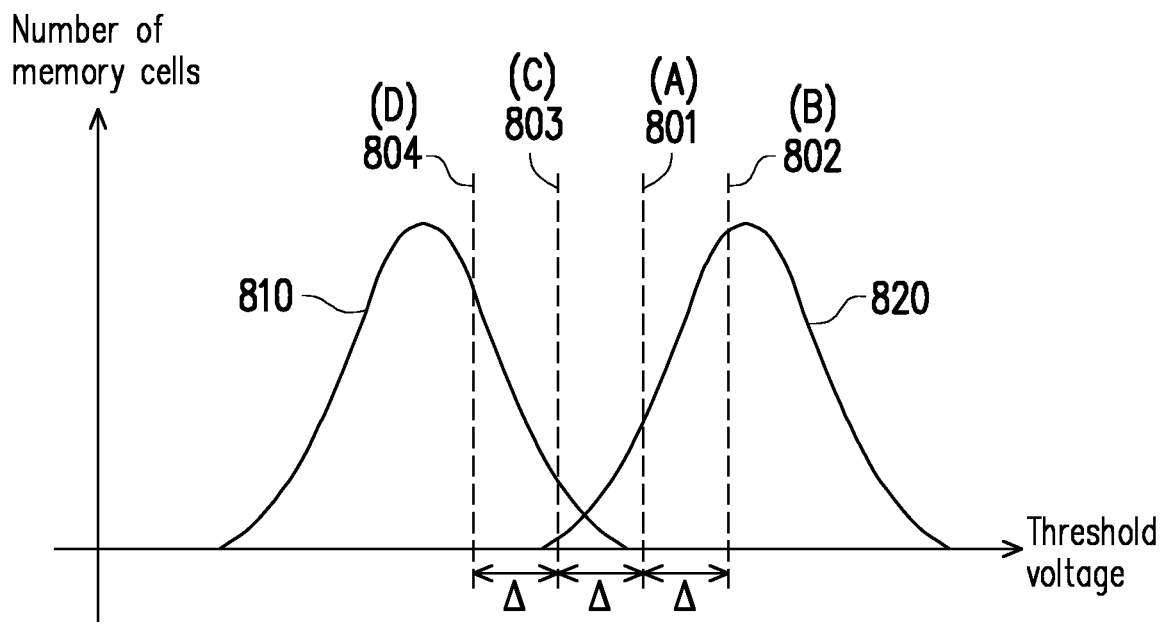
FIG. 8A to FIG. 8C are schematic diagrams of adjusting a read voltage level in a first decoding mode according to an exemplary embodiment of the disclosure.
Figure 8B:
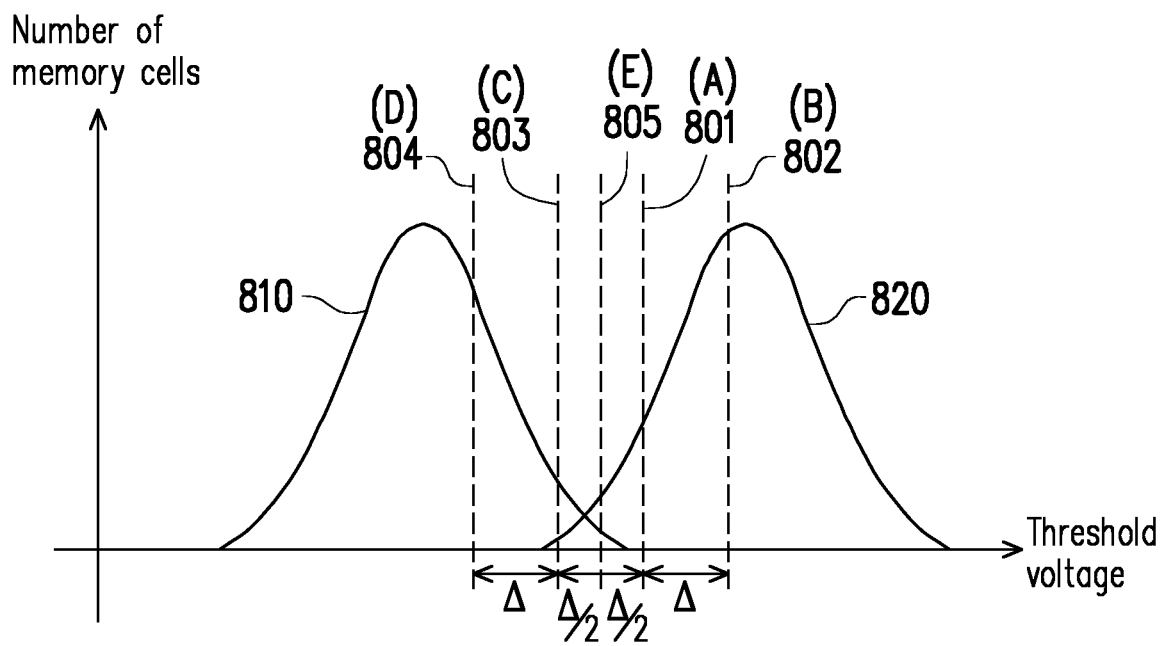
Figure 8C:
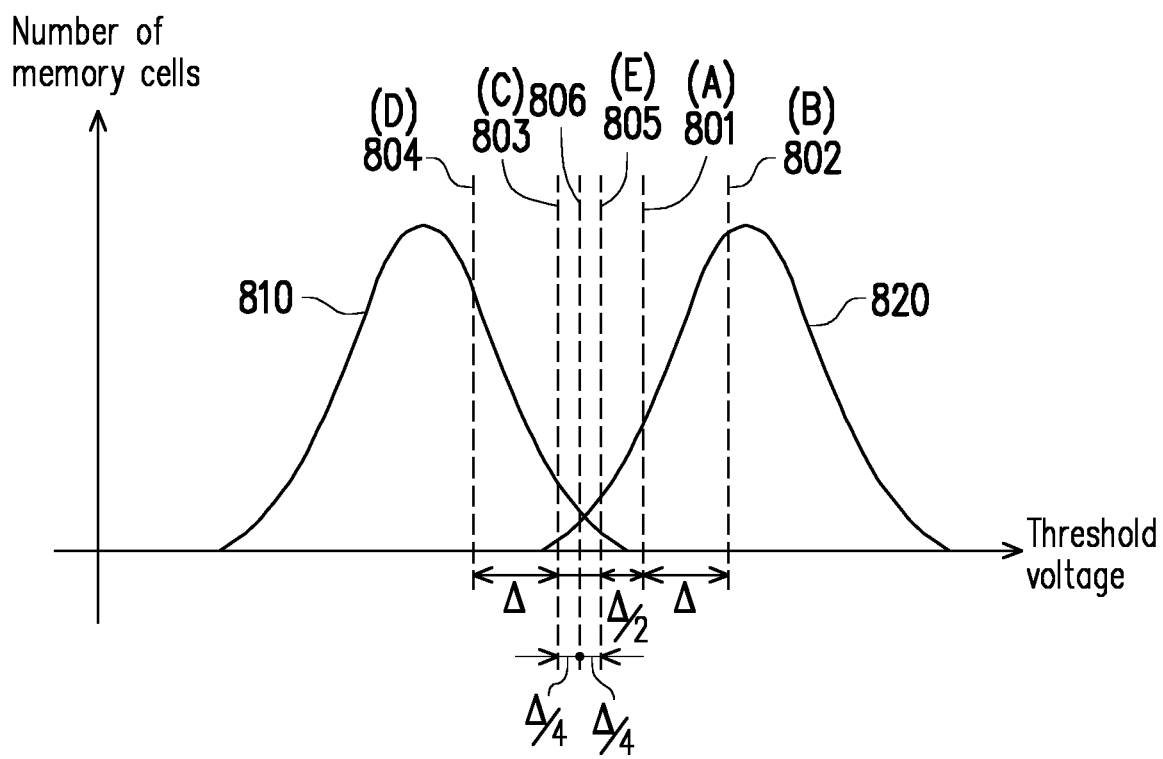

FIG. 8A to FIG. 8C are schematic diagrams of adjusting a RVL in a first decoding mode according to an exemplary embodiment of the disclosure.

Referring to FIG. 8A, in the present exemplary embodiment, it is assumed that a threshold voltage distribution of the memory cells in the first physical unit includes states 810 and 820. In the first decoding mode, the MMC 502 may instruct a reading of the first physical unit based on a RVL 801 to obtain data A. For example, the data A may reflect a conduction state of the memory cells in the first physical unit in response to the RVL 801. The ECCC 508 may decode the data A. If the decoding of the data A is failed, the MMC 502 may instruct a reading of the first physical unit based on a RVL 802 to obtain data B. For example, the data B may reflect a conduction state of the memory cells in the first physical unit in response to the RVL 802. The ECCC 508 may decode the data B. If the decoding of the data B is failed, the MMC 502 may instruct a reading of the first physical unit based on a RVL 803 to obtain data C. For example, the data C may reflect a conduction state of the memory cells in the first physical unit in response to the RVL 803. The ECCC 508 may decode the data C.

In the present exemplary embodiment, the voltage value of the RVL 802 is higher than the voltage value of the RVL 801, and the voltage value of the RVL 801 is higher than the voltage value of the RVL 803. However, in another exemplary embodiment, the voltage value of the RVL 802 and the voltage value of the RVL 803 may also be exchanged, such that the voltage value of the RVL 803 may be higher than the voltage value of the RVL 802.

In the present exemplary embodiment, the decoding of the data C is failed. Therefore, the MMC 502 may obtain a reference value R_AB according to the data A and the data B. The reference value R_AB reflects a data variation status between the data A and the data B. The reference value R_AB may also reflect the total number of memory cells in which the conduction state is changed in the first physical unit in response to the RVLs 801 and 802. For example, the reference value R_AB may be obtained by performing the above logical operation on the data A and the data B.

On the other hand, the MMC 502 may obtain a reference value R_AC based on the data A and the data C. The reference value R_AC reflects a data variation status between the data A and the data C. The reference value R_AC may also reflect the total number of memory cells in which the conduction state is changed in the first physical unit in response to the RVLs 801 and 803. For example, the reference value R_AC may also be obtained by performing the above logical operations on the data A and the data C.

The MMC 502 may determine a RVL 804 based on the reference values R_AB and R_AC. For example, in the present exemplary embodiment, the MMC 502 may determine the RVL 804 in response to a numerical relationship indicating that the reference value R_AC is less than reference value R_AB. A voltage value of the RVL 804 is lower than the voltage value of the RVL 803. The MMC 502 may instruct a reading of the first physical unit based on the RVL 804 according to the reference values R_AB and R_AC to obtain the data D. For example, the data D may reflect a conduction state of the memory cells in the first physical unit in response to the RVL 804. The ECCC 508 may decode the data D.

In the present exemplary embodiment, the decoding of the data D is failed. Therefore, the MMC 502 may obtain a reference value R_CD according to the data C and the data D. The reference value R_CD reflects a data variation status between the data C and the data D. The reference value R_CD may also reflect the total number of memory cells in which the conduction state is changed in the first physical unit in response to the RVLs 803 and 804. For example, the reference value R_CD may be obtained by performing the above logical operations on the data C and the data D.

Referring to FIG. 8B, the MMC 502 may determine a RVL 805 according to the reference values R_AC and R_CD. For example, the MMC 502 may determine the RVL 805 in response to a numerical relationship indicating that the reference value R_AC is less than the reference value R_CD. A voltage value of RVL 805 is located between the voltage value of the RVL 801 and the voltage value of the RVL 803. The MMC 502 may instruct a reading of the first physical unit based on the RVL 805 according to the reference values R_AC and R_CD to obtain data E. For example, the data E may reflect a conduction state of the memory cells in the first physical unit in response to the RVL 805. The ECCC 508 may decode the data E.

In the present exemplary embodiment, the decoding of the data E is failed. Therefore, the MMC 502 may obtain a reference value R_AE based on the data A and the data E. The reference value R_AE reflects a data variation status between the data A and the data E. The reference value R_AE may also reflect the total number of memory cells in which the conduction state is changed in the first physical unit in response to the RVLs 801 and 805. For example, the reference value R_AE may also be obtained by performing the above logical operations on the data A and the data E. In addition, the MMC 502 may obtain the reference value R_EC according to the data E and the data C. The reference value R_EC reflects a data variation status between the data E and the data C. The reference value R_EC may also reflect the total number of memory cells in which the conduction state is changed in the first physical unit in response to the RVLs 805 and 803. The reference value R_EC may also be obtained by performing the above logical operations on the data E and the data C. Alternatively, the MMC 502 may obtain the reference value R_EC according to the reference values R_AC and R_AE. For example, the MMC 502 may subtract the reference value R_AE from the reference value R_AC to obtain the reference value R_EC.

Referring to FIG. 8C, the MMC 502 may determine a RVL 806 according to the reference values R_AE and R_EC. For example, in the present exemplary embodiment, the MMC 502 determines the RVL 806 in response to a numerical relationship indicating that the reference value R_EC is less than the reference value R_AE. A voltage value of the RVL 806 is between the voltage value of the RVL 805 and the voltage value of the RVL 803. The MMC 502 may instruct a reading of the first physical unit based on the RVL 806 according to the reference values R_AE and the R_EC. The ECCC 508 may continue to perform decoding operations in the first decoding mode.

Figure 9:
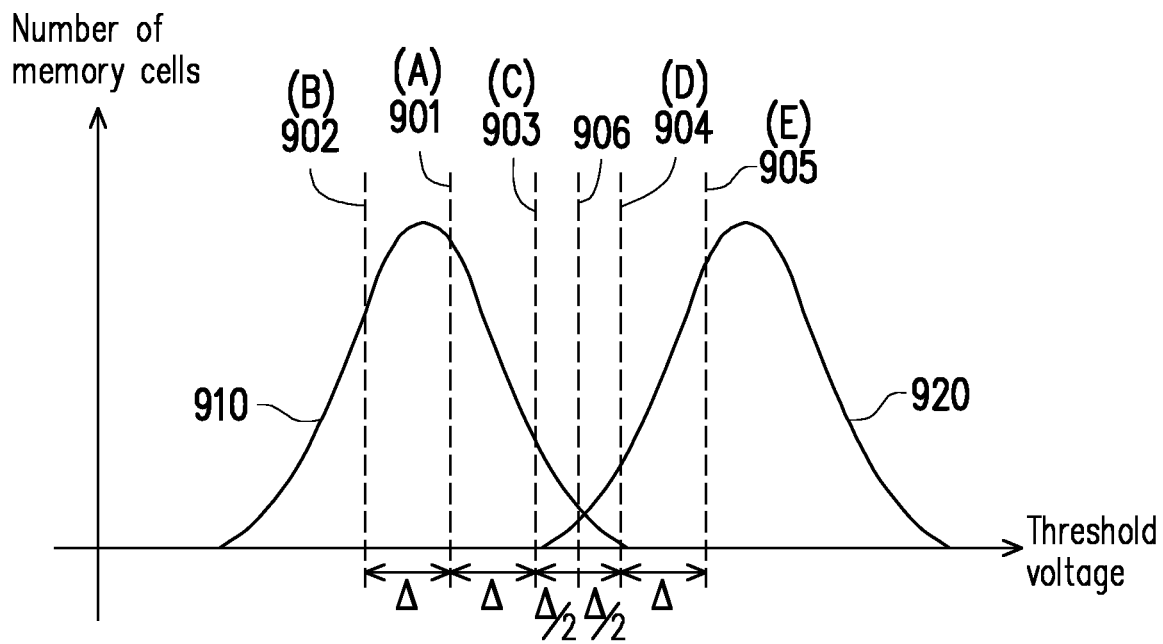
FIG. 9 is a schematic diagram of adjusting a read voltage level in a first decoding mode according to an exemplary embodiment of the disclosure.

FIG. 9 is a schematic diagram of adjusting a RVL in a first decoding mode according to an exemplary embodiment of the disclosure.

Referring to FIG. 9, in the present exemplary embodiment, it is assumed that a threshold voltage distribution of the memory cells in the first physical unit includes states 910 and 920. In the first decoding mode, the MMC 502 may instruct a reading of the first physical unit based on a RVL 901 to obtain data A. The ECCC 508 may decode the data A. If the decoding of the data A is failed, the MMC 502 may instruct a reading of the first physical unit based on a RVL 902 to obtain data B. The ECCC 508 may decode the data B. If the decoding of the data B is failed, the MMC 502 may instruct a reading of the first physical unit based on a RVL 903 to obtain data C. The ECCC 508 may decode the data C.

If the decoding of the data C is failed, the MMC 502 may obtain reference values R_AB and R_AC. The reference value R_AB reflects a data variation status between the data A and the data B (and/or the total number of memory cells in which the conduction state is changed in the first physical unit in response to the RVLs 901 and 902). The reference value R_AC reflects a data variation status between the data A and the data C (and/or the total number of memory cells in which the conduction state is changed in the first physical unit in response to the RVLs 901 and 903). The MMC 502 may determine a RVL 904 based on the reference values R_AB and R_AC. For example, in the present exemplary embodiment, the MMC 502 determines the RVL 904 in response to a numerical relationship indicating that the reference value R_AC is less than reference value R_AB. The MMC 502 may instruct a reading of the first physical unit based on the RVL 904 to obtain the data D. The ECCC 508 may decode the data D.

If the decoding of the data D is failed, the MMC 502 may obtain a reference value R_CD. The reference value R_CD reflects a data variation status between the data C and the data D (and/or the total number of memory cells in which the conduction state is changed in the first physical unit in response to the RVLs 903 and 904). The MMC 502 may determine a RVL 905 according to the reference values R_AC and R_CD. For example, in the present exemplary embodiment, the MMC 502 may determine the RVL 905 in response to a numerical relationship indicating that the reference value R_CD is less than the reference value R_AC. The MMC 502 may instruct a reading of the first physical unit based on the RVL 905 to obtain data E. The ECCC 508 may decode the data E.

If the decoding of the data E is failed, the MMC 502 may obtain a reference value R_DE. The reference value R_DE reflects a data variation status between the data D and the data E (and/or the total number of memory cells in which the conduction state is changed in the first physical unit in response to the RVLs 904 and 905). The MMC 502 may determine a RVL 906 according to the reference values R_CD and R_DE. For example, in the present exemplary embodiment, the MMC 502 determines the RVL 906 in response to a numerical relationship indicating that the reference value R_CD is less than the reference value R_DE. The MMC 502 may instruct a reading of the first physical unit based on the RVL 906. The ECCC 508 may continue to perform decoding operations in the first decoding mode.

Figure 10:
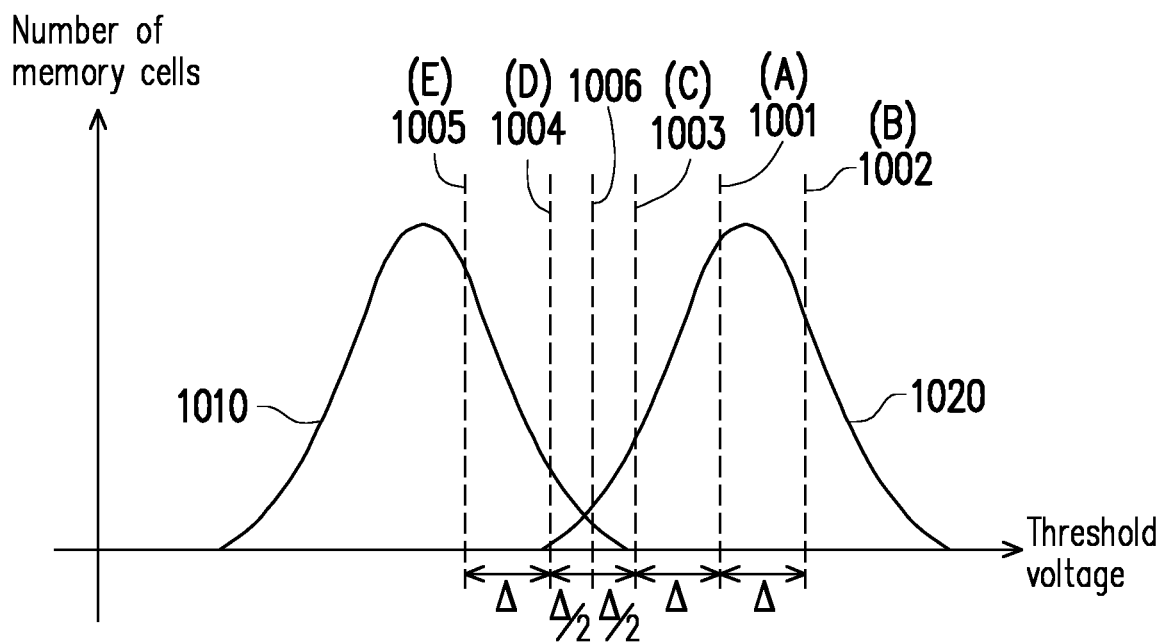
FIG. 10 is a schematic diagram of adjusting a read voltage level in a first decoding mode according to an exemplary embodiment of the disclosure.

FIG. 10 is a schematic diagram of adjusting a RVL in a first decoding mode according to an exemplary embodiment of the disclosure.

Referring to FIG. 10, in the present exemplary embodiment, it is assumed that a threshold voltage distribution of the memory cells in the first physical unit includes states 1010 and 1020. In the first decoding mode, the MMC 502 may instruct a reading of the first physical unit based on a RVL 1001 to obtain data A. The ECCC 508 may decode the data A. If the decoding of the data A is failed, the MMC 502 may instruct a reading of the first physical unit based on a RVL 1002 to obtain data B. The ECCC 508 may decode the data B. If the decoding of the data B is failed, the MMC 502 may instruct a reading of the first physical unit based on a RVL 1003 to obtain data C. The ECCC 508 may decode the data C.

If the decoding of the data C is failed, the MMC 502 may obtain reference values R_AB and R_AC. The reference value R_AB reflects a data variation status between the data A and the data B (and/or the total number of memory cells in which the conduction state is changed in the first physical unit in response to the RVLs 1001 and 1002). The reference value R_AC reflects a data variation status between the data A and the data C (and/or the total number of memory cells in which the conduction state is changed in the first physical unit in response to the RVLs 1001 and 1003). The MMC 502 may determine a RVL 1004 based on the reference values R_AB and R_AC. For example, in the present exemplary embodiment, the MMC 502 determines the RVL 1004 in response to a numerical relationship indicating that the reference value R_AC is less than reference value R_AB. The MMC 502 may instruct a reading of the first physical unit based on the RVL 1004 to obtain the data D. The ECCC 508 may decode the data D.

If the decoding of the data D is failed, the MMC 502 may obtain a reference value R_CD. The reference value R_CD reflects a data variation status between the data C and the data D (and/or the total number of memory cells in which the conduction state is changed in the first physical unit in response to the RVLs 1003 and 1004). The MMC 502 may determine a RVL 1005 according to the reference values R_AC and R_CD. For example, in the present exemplary embodiment, the MMC 502 may determine the RVL 1005 in response to a numerical relationship indicating that the reference value R_CD is less than the reference value R_AC. The MMC 502 may instruct a reading of the first physical unit based on the RVL 1005 to obtain data E. The ECCC 508 may decode the data E.

If the decoding of the data E is failed, the MMC 502 may obtain a reference value R_DE. The reference value R_DE reflects a data variation status between the data D and the data E (and/or the total number of memory cells in which the conduction state is changed in the first physical unit in response to the RVLs 1004 and 1005). The MMC 502 may determine a RVL 1006 according to the reference values R_CD and R_DE. For example, in the present exemplary embodiment, the MMC 502 determines the RVL 1006 in response to a numerical relationship indicating that the reference value R_CD is less than the reference value R_DE. The MMC 502 may instruct a reading of the first physical unit based on the RVL 1006. The ECCC 508 may continue to perform decoding operations in the first decoding mode.

It is noted that, the voltage gap between each pair of adjacent RVLs in FIG. 7A to FIG. 10 is not a fixed value. In the first decoding mode, as the retry count increases, the RVL to be used may also be gradually adjusted (or converged) to near the optimal RVL (e.g., near the center of a V-shape between two adjacent states). Thereby, the decoding performance and/or decoding success rate of the ECCC 508 may be gradually improved. Traditionally, the RVL being adjusted merely according to the retry table may cause the RVL to diverge (unlike the convergence in FIG. 7A to FIG. 10), which may make the decoding success rate being lower.

In an example embodiment, the MMC 502 may also collect information obtained by reading the first physical unit based on a plurality of RVLs in the first decoding mode (or before entering the second decoding mode). The MMC 502 may obtain reliability information corresponding to the first physical unit based on the collected information. In the first decoding mode (or before entering the second decoding mode), the ECCC 508 may perform a decoding operation based on the reliability information. In other words, before entering the second decoding mode (i.e., in the beginning of decoding), the decoding performance and/or decoding success rate of the ECCC 508 may be effectively improved based on the information collected in the first decoding mode. Moreover, in some exemplary embodiments of FIG. 7A to FIG. 10, more RVLs may be used to continuously perform the decoding operation.

Figure 11:
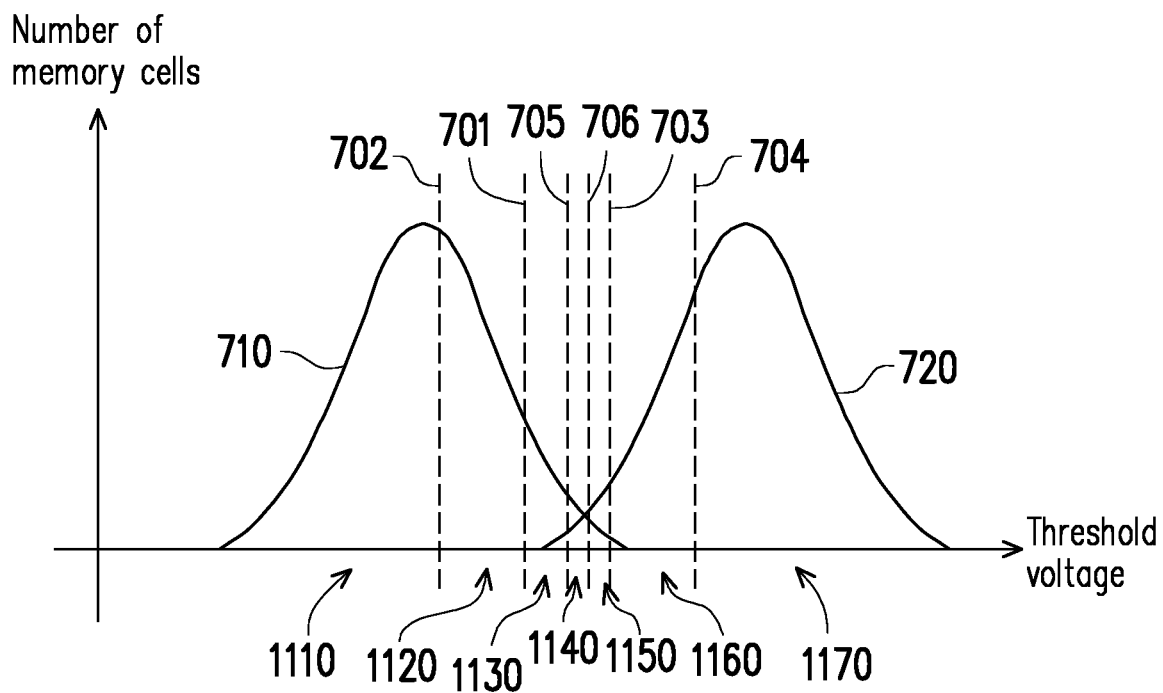
FIG. 11 is a schematic diagram of obtaining reliability information in a first decoding mode according to an exemplary embodiment of the present disclosure.

FIG. 11 is a schematic diagram of obtaining reliability information in a first decoding mode according to an exemplary embodiment of the present disclosure.

Referring to FIG. 11, in an example embodiment continued from FIG. 7C, the MMC 502 may divide a plurality of voltage ranges 1110-1170 according to the RVLs 701-706. For example, the voltage range 1110 includes a voltage range where the voltage value therein is less than the RVL 702, and the voltage range 1120 includes a voltage range between the RVLs 702 and 701, etc., as shown in FIG. 11. It is noted that, the voltage gap between any two adjacent RVLs of the RVLs 701-706 is not a fixed value. For example, the voltage gap (e.g., A) between the RVLs 702 and 701 is different from the voltage gap (e.g., $\Delta/2$) between the RVLs 701 and 705, and the voltage gap between the RVLs 701 and 705 is also different from the voltage gap (e.g., $\Delta/4$) between the RVLs 705 and 706. Alternatively, from another point of view, the voltage ranges 1120 to 1160 includes voltage ranges formed by at least two or more voltage gaps (i.e., $\Delta$, $\Delta/2$, and $\Delta/4$).

The MMC 502 may evaluate that a voltage of a memory cell in the first physical unit is located in a specific voltage range among the voltage ranges 1110-1170 according to the information (e.g., the data A-E) collected by reading the first physical unit based on the RVLs 701-706. The MMC 502 may determine the reliability information corresponding to this memory cell according to the voltage range. For example, it is assumed that the MMC 502 determines that a voltage of a certain memory cell is in the voltage range 1130 based on the collected information. The MMC 502 may dynamically determine the reliability information corresponding to this memory cell according to the relative position of the voltage range 1130 and other voltage ranges. In the first decoding mode, the ECCC 508 may decode the data read from this memory cell according to the reliability information, thereby effectively improving the decoding success rate.

In an example embodiment, the MMC 502 may determine whether a condition for updating the reliability information is satisfied in the first decoding mode. If the condition for updating the reliability information has been satisfied, for example, four or more RVLs have been used to read the first physical unit, the MMC 502 may update the reliability information based on the obtained information. However, if the condition for updating the reliability information has not been satisfied, for example, the first physical unit has not been read by four or more RVLs, the MMC 502 may not update the reliability information based on the obtained information.

In an exemplary embodiment, after initially obtaining the reliability information according to some RVLs in the first decoding mode, if more RVLs are continuously used to read the first physical unit, then more voltage ranges may be further defined and/or divided. The MMC 502 may continuously evaluate that a voltage of a specific memory cell is located in a specific voltage range according to the obtained information and update the reliability information corresponding to this memory cell according to the evaluation result. In this way, the continuously updated reliability information may be more consistent with the current threshold voltage distribution state of the memory cells in the first physical unit. In addition, through the gradual convergence of the RVL, the resolution of the divided voltage range may become higher to provide more accurate reliability information.

In an example embodiment, after entering the second decoding mode, the MMC 502 may read the first physical unit based on a plurality of RVLs to obtain the soft bits. The MMC 502 may determine the reliability information corresponding to the first physical unit according to the obtained soft bits.

Figure 12:
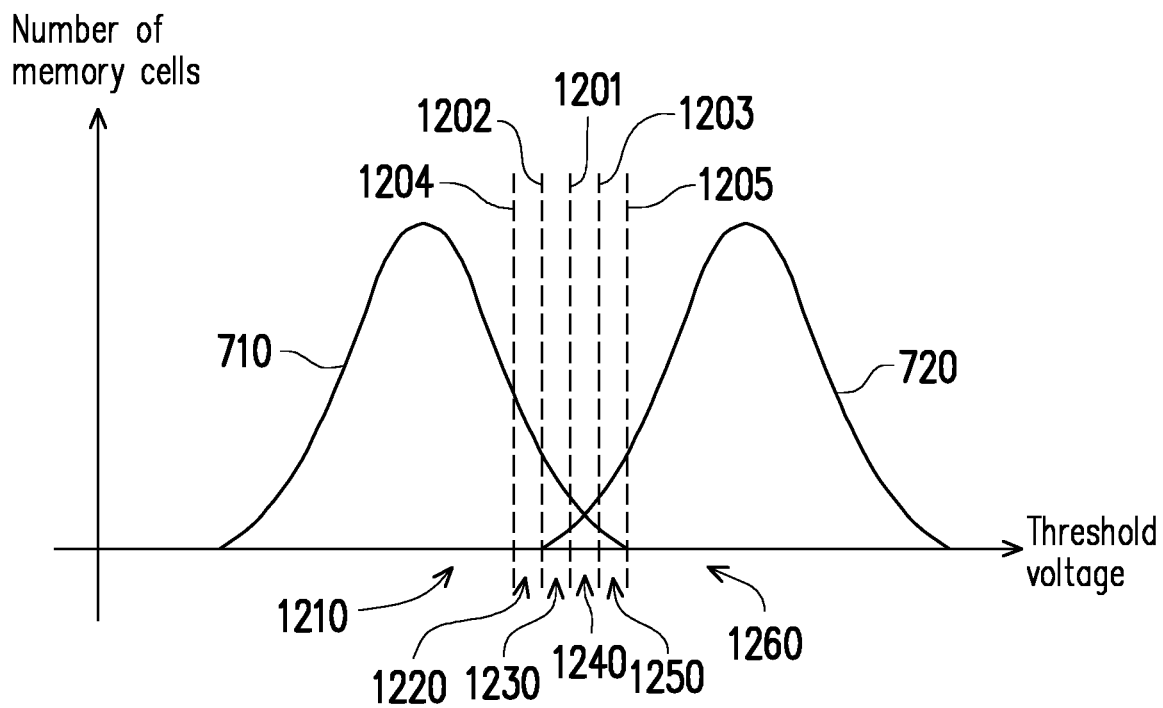
FIG. 12 is a schematic diagram of obtaining reliability information in a second decoding mode according to an exemplary embodiment of the present disclosure.

FIG. 12 is a schematic diagram of obtaining reliability information in a second decoding mode according to an exemplary embodiment of the present disclosure.

Referring to FIG. 12, following the example embodiment of FIG. 7C, after entering the second decoding mode, the MMC 502 may read the first physical unit based on the RVLs 1201-1205 to obtain the soft bits. For example, the RVLs 1201-1205 may be used to divide multiple voltage ranges 1210-1260. The MMC 502 may determine that the voltage of a certain memory cell is within a certain voltage range among the voltage ranges 1210-1260 according to the obtained soft bits. The MMC 502 may determine the reliability information corresponding to this memory cell according to the determined voltage range. For example, it is assumed that the MMC 502 determines that the voltage of a specific memory cell is within the voltage range 1240 based on the obtained soft bits. The MMC 502 may determine the reliability information corresponding to this memory cell according to the voltage range 1240.

It is noted that, the RVLs 1201-1205 are used to read the first physical unit after entering the second decoding mode. The voltage gap between any two adjacent voltage levels in the RVLs 1201-1205 is a fixed value. The RVLs 1201-1205 are different from the RVLs 701-706 in the exemplary embodiment of FIG. 11.

In the exemplary embodiment of FIG. 12, the ECCC 508 performs a decoding operation only after the RVLs 1201-1205 are all used to read the memory cells in the first physical unit. However, in the exemplary embodiments of FIG. 7A to FIG. 7C and FIG. 11, data may be successfully decoded after reading the first physical unit by using one of the RVLs 701-706. Thereby, the decoding success rate of the ECCC 508 in the first decoding mode may be close to the decoding success rate of the ECCC 508 in the second decoding mode, thereby improving the overall decoding performance of the ECCC 508.

Figure 13:
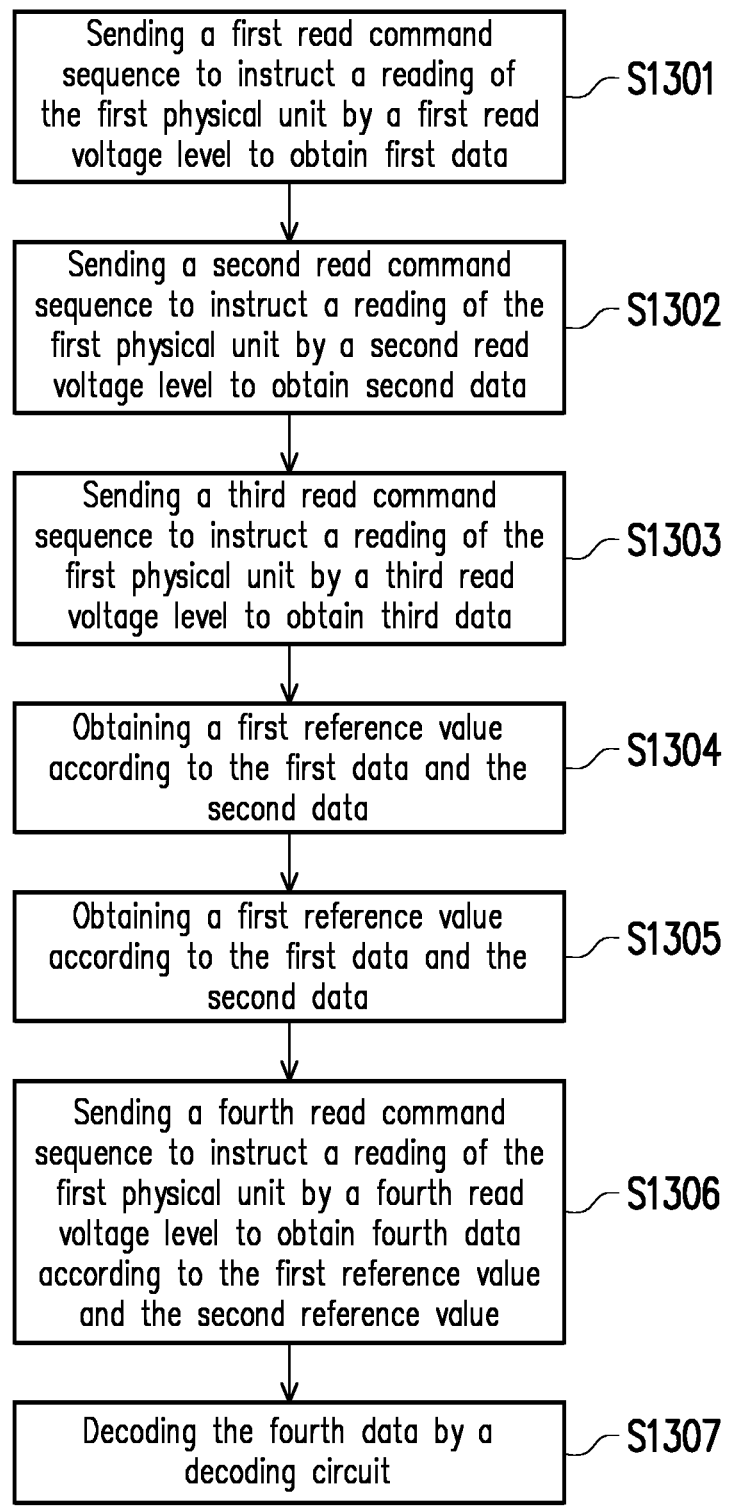
FIG. 13 is a flowchart of a memory control method according to an exemplary embodiment of the disclosure.

FIG. 13 is a flowchart of a memory control method according to an exemplary embodiment of the disclosure.

Referring to FIG. 13, in step S1301, a first read command sequence is sent to instruct a reading of a first physical unit based on a first RVL to obtain first data. In step S1302, a second read command sequence is sent to instruct a reading of the first physical unit based on a second RVL to obtain second data. In step S1303, a third read command sequence is sent to instruct a reading of the first physical unit based on a third RVL to obtain third data. The voltage of the first RVL may be higher than the voltage of the second RVL. The voltage of the third RVL may be higher than the voltage of the first RVL. In step S1304, a first reference value is obtained according to the first data and the second data, and the first reference value reflects a data variation status between the first data and the second data. In step S1305, a second reference value is obtained according to the first data and the third data, and the second reference value reflects a data variation status between the first data and the third data. In step S1306, a fourth read command sequence is sent according to the first reference value and the second reference value to instruct a reading of the first physical unit based on a fourth RVL to obtain fourth data. In step S1307, the fourth data is decoded by a decoding circuit.

It is noted that, the execution order of the steps S1302 and S1303 in FIG. 13 may be adjusted. For example, in another exemplary embodiment, the step S1303 may be performed first and then step S1302 may be performed, which is not limited by the present disclosure. Further, the execution order of the steps S1304 and S1305 may also be adjusted.

Figure 14:
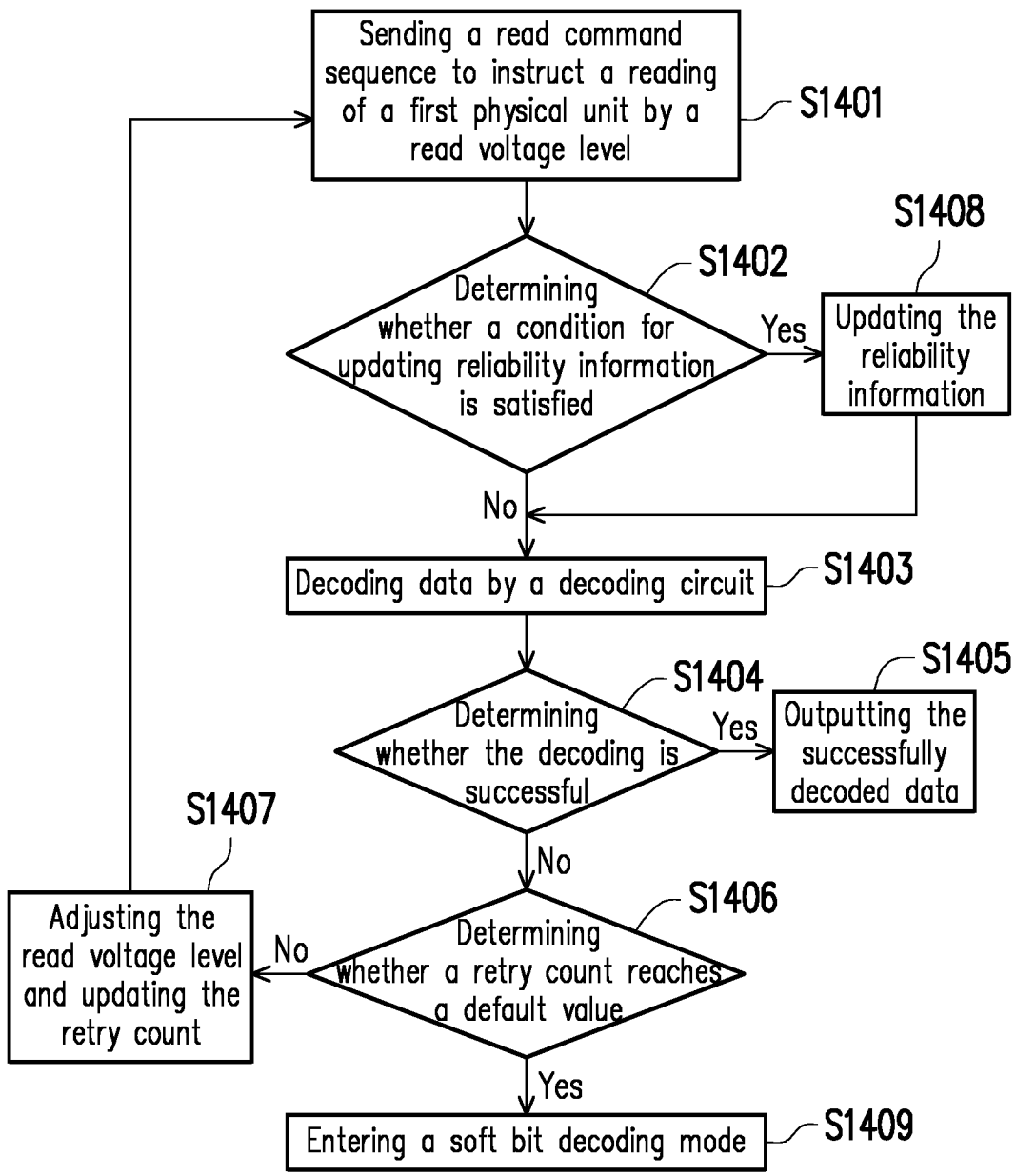
FIG. 14 is a flowchart of a memory control method according to an exemplary embodiment of the disclosure.

FIG. 14 is a flowchart of a memory control method according to an exemplary embodiment of the disclosure.

Referring to FIG. 14, after entering a first decoding mode, in step S1401, a read command sequence is sent to instruct a reading of a first physical unit based on a RVL. In step S1402, it is determined whether a condition for updating reliability information is satisfied. If the condition for updating the reliability information is not satisfied, for example, information sufficiently reflecting the voltage position of the memory cells has not been obtained, in step S1403, data is decoded by the decoding circuit. In step S1404, it is determined whether the decoding is successful. If the decoding is successful, in step S1405, the successfully decoded data is output. If the decoding fails, in step S1406, it is determined whether a retry count has reached a preset value. If the retry count has not reached the preset value, in step S1407, the RVL is adjusted and the retry count is updated. After the step S1407, the steps S1401 and S1402 may be repeated.

It is noted that, in the step S1402, if it is determined that the condition for updating the reliability information has been satisfied, for example, sufficient information for determining the voltage position of the memory cells has been collected, then in step S1408, the reliability information may be updated. Then, in the step S1403, the decoding circuit may decode data according to the reliability information, thereby improving the decoding success rate of the decoding circuit in the first decoding mode. Further, in the step S1406, if it is determined that the retry count has reached the preset value, then in step S1409, a second decoding mode (for example, a soft bit decoding mode) is entered.

However, the steps in FIG. 13 and FIG. 14 have been described in detail above and may not be reiterated here. It shall be noted that the steps in FIG. 13 and FIG. 14 may be implemented as multiple program codes or circuits, and the disclosure is not limited thereto. In addition, the methods of FIG. 13 and FIG. 14 may be used in combination with the embodiments above or may be used alone, and the disclosure is not limited thereto.

Based on the above, in the first decoding mode, the RVLs to be used may be gradually converged to a better voltage position according to the read data, so as to reduce errors in the read data and/or improve decoding success rate. In addition, in the first decoding mode, data read based on different RVLs may be used to obtain and/or update the reliability information. According to the reliability information, the decoding success rate of the first decoding mode may be greatly improved, even approaching the decoding success rate of the second decoding mode. Thereby, the overall decoding performance of the decoding circuit may be effectively improved. Since the overall decoding performance of the decoding circuit is improved, the data access performance of the memory storage device may be improved, and the overall memory storage device may be effectively improved.

The previously described exemplary embodiments of the present disclosure have the advantages aforementioned, wherein the advantages aforementioned not required in all versions of the disclosure.

It may be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory control method, for a rewritable non-volatile memory module, wherein the rewritable non-volatile memory module comprises a plurality of physical units, and the memory control method comprises:
   sending a first read command sequence which instructs a reading of a first physical unit among the physical units based on a first read voltage level to obtain first data;
   sending a second read command sequence which instructs a reading of the first physical unit based on a second read voltage level to obtain second data;
   sending a third read command sequence which instructs a reading of the first physical unit based on a third read voltage level to obtain third data;
   obtaining a first reference value according to the first data and the second data, wherein the first reference value reflects a data variation status between the first data and the second data;
   obtaining a second reference value according to the first data and the third data, wherein the second reference value reflects a data variation status between the first data and the third data;
   sending a fourth read command sequence which instructs a reading of the first physical unit based on a fourth read voltage level to obtain fourth data according to a numerical relationship merely between the first reference value and the second reference value;
   decoding the fourth data by a decoding circuit,
   obtaining a third reference value according to the fourth data and target data, wherein the target data is one of the second data and the third data, and the third reference value reflects a data variation status between the fourth data and the target data;
   sending a fifth read command sequence which instructs a reading of the first physical unit based on a fifth read voltage level to obtain fifth data according to the third reference value;
   decoding the fifth data by the decoding circuit,
   wherein a first voltage gap is a voltage difference between a voltage value of the fourth read voltage level and a voltage value of the second read voltage level or a voltage value of the third read voltage level,
   wherein a second voltage gap is a voltage difference between a voltage value of the fifth read voltage level and a voltage value of one of the first read voltage level, the second read voltage level, the third read voltage level, and the fourth read voltage level,
   wherein a voltage of the second voltage gap is half of a voltage of the first voltage gap,
   collecting information which is obtained by reading the first physical unit based on a plurality of read voltage levels before entering a soft bit decoding mode, wherein the plurality of read voltage levels comprise the first read voltage level, the second read voltage level, the third read voltage level, the fourth read voltage level, and the fifth read voltage level;
   obtaining reliability information corresponding to the first physical unit according to the collected information; and
   performing a decoding operation according to the reliability information by the decoding circuit before entering the soft bit decoding mode,
   wherein the reliability information is determined according to at least two or more voltage gaps.

2. The memory control method according to claim 1, wherein a voltage value of the first read voltage level is higher than a voltage value of the second read voltage level, a voltage value of the third read voltage level is higher than the voltage value of the first read voltage level, and a step of sending the fourth read command sequence which instructs the reading of the first physical unit based on the fourth read voltage level to obtain the fourth data according to the numerical relationship between the first reference value and the second reference value comprises:
   determining the fourth read voltage level according to the numerical relationship between the first reference value and the second reference value.

3. The memory control method according to claim 2, wherein a step of determining the fourth read voltage level according to the numerical relationship between the first reference value and the second reference value comprises:
   determining the fourth read voltage level and a voltage value of the determined fourth read voltage level is higher than the voltage value of the third read voltage level if the numerical relationship between the first reference value and the second reference value is a first numerical relationship; and
   determining the fourth read voltage level and the voltage value of the determined fourth read voltage level is lower than the voltage value of the second read voltage level if the numerical relationship between the first reference value and the second reference value is a second numerical relationship.

4. The memory control method according to claim 1, wherein a voltage value of the fifth read voltage level is located between a voltage value of the second read voltage level and a voltage value of the third read voltage level.

5. The memory control method according to claim 1, wherein a voltage value of the fourth read voltage level is higher than a voltage value of the third read voltage level, and a voltage value of the fifth read voltage level is higher than the voltage value of the fourth read voltage level.

6. The memory control method according to claim 1, wherein a voltage value of the fourth read voltage level is lower than a voltage value of the second read voltage level, and a voltage value of the fifth read voltage level is lower than the voltage value of the fourth read voltage level.

7. The memory control method according to claim 1, further comprising:
   decoding the first data by the decoding circuit;
   decoding one of the second data and the third data by the decoding circuit after decoding the first data; and
   decoding the other one of the second data and the third data by the decoding circuit after the one of the second data and the third data is decoded.

8. A memory storage device, comprising:
   a connection interface unit, configured to connect a host system;
   a rewritable non-volatile memory module which comprises a plurality of physical units; and
   a memory control circuit unit, coupled to the connection interface unit and the rewritable non-volatile memory module,
   wherein the memory control circuit unit is configured to send a first read command sequence which instructs a reading of a first physical unit among the physical units based on a first read voltage level to obtain first data, the memory control circuit unit is further configured to send a second read command sequence which instructs a reading of the first physical unit based on a second read voltage level to obtain second data, the memory control circuit unit is further configured to send a third read command sequence which instructs a reading of the first physical unit based on a third read voltage level to obtain third data, the memory control circuit unit is further configured to obtain a first reference value according to the first data and the second data, wherein the first reference value reflects a data variation status between the first data and the second data, the memory control circuit unit is further configured to obtain a second reference value according to the first data and the third data, wherein the second reference value reflects a data variation status between the first data and the third data, the memory control circuit unit is further configured to send a fourth read command sequence which instructs a reading of the first physical unit based on a fourth read voltage level to obtain fourth data according to a numerical relationship merely between the first reference value and the second reference value, the memory control circuit unit is further configured to decode the fourth data, wherein the memory control circuit unit is further configured to obtain a third reference value according to the fourth data and target data, wherein the target data is one of the second data and the third data, and the third reference value reflects a data variation status between the fourth data and the target data, the memory control circuit unit is further configured to send a fifth read command sequence which instructs a reading of the first physical unit based on a fifth read voltage level to obtain fifth data according to the third reference value, the memory control circuit unit is further configured to decode the fifth data, wherein a first voltage gap is a voltage difference between a voltage value of the fourth read voltage level and a voltage value of the second read voltage level or a voltage value of the third read voltage level, wherein a second voltage gap is a voltage difference between a voltage value of the fifth read voltage level and a voltage value of one of the first read voltage level, the second read voltage level, the third read voltage level, and the fourth read voltage level, wherein a voltage of the second voltage gap is half of a voltage of the first voltage gap, wherein the memory control circuit unit is further configured to collect info illation which is obtained by reading the first physical unit based on a plurality of read voltage levels before entering a soft bit decoding mode, and the plurality of read voltage levels comprise the first read voltage level, the second read voltage level, the third read voltage level, the fourth read voltage level, and the fifth read voltage level, the memory control circuit unit is further configured to obtain reliability information corresponding to the first physical unit according to the collected information, and the memory control circuit unit is further configured to perform a decode operation according to the reliability information before entering the soft bit decoding mode, wherein the reliability information is determined according to at least two or more voltage gaps.

9. The memory storage device according to claim 8, wherein a voltage value of the first read voltage level is higher than a voltage value of the second read voltage level, a voltage value of the third read voltage level is higher than the voltage value of the first read voltage level, and an operation of sending the fourth read command sequence which instructs the reading of the first physical unit based on the fourth read voltage level to obtain the fourth data according to the numerical relationship between the first reference value and the second reference value by the memory control circuit unit comprises:

determining the fourth read voltage level according to the numerical relationship between the first reference value and the second reference value.

10. The memory storage device according to claim 9, wherein an operation of determining the fourth read voltage level according to the numerical relationship between the first reference value and the second reference value by the memory control circuit unit comprises:

determining the fourth read voltage level and a voltage value of the determined fourth read voltage level is higher than the voltage value of the third read voltage level if the numerical relationship between the first reference value and the second reference value is a first numerical relationship; and determining the fourth read voltage level and the voltage value of the determined fourth read voltage level is lower than the voltage value of the second read voltage level if the numerical relationship between the first reference value and the second reference value is a second numerical relationship.

11. The memory storage device according to claim 8, wherein a voltage value of the fifth read voltage level is located between a voltage value of the second read voltage level and a voltage value of the third read voltage level.

12. The memory storage device according to claim 8, wherein a voltage value of the fourth read voltage level is higher than a voltage value of the third read voltage level, and a voltage value of the fifth read voltage level is higher than the voltage value of the fourth read voltage level.

13. The memory storage device according to claim 8, wherein a voltage value of the fourth read voltage level is lower than a voltage value of the second read voltage level, and a voltage value of the fifth read voltage level is lower than the voltage value of the fourth read voltage level.

14. The memory storage device according to claim 8, wherein the memory control circuit unit is further configured to decode the first data, the memory control circuit unit is further configured to decode one of the second data and the third data after decoding the first data, and the memory control circuit unit is further configured to decode the other one of the second data and the third data after the one of the second data and the third data is decoded.

15. A memory control circuit unit for controlling a rewritable non-volatile memory module comprising a plurality of physical units, and the memory control circuit unit comprising:

a host interface, configured to couple to a host system;
a memory interface, configured to couple to the rewritable non-volatile memory module;
a decoding circuit; and
a memory management circuit, coupled to the host interface, the memory interface and the decoding circuit, wherein the memory management circuit is configured to send a first read command sequence which instructs a reading of a first physical unit among the physical units based on a first read voltage level to obtain first data, the memory management circuit is further configured to send a second read command sequence which instructs a reading of the first physical unit based on a second read voltage level to obtain second data, the memory management circuit is further configured to send a third read command sequence which instructs a reading of the first physical unit based on a third read voltage level to obtain third data, the memory management circuit is further configured to obtain a first reference value according to the first data and the second data, wherein the first reference value reflects a data variation status between the first data and the second data, the memory management circuit is further configured to obtain a second reference value according to the first data and the third data, wherein the second reference value reflects a data variation status between the first data and the third data, the memory management circuit is further configured to send a fourth read command sequence which instructs a reading of the first physical unit based on a fourth read voltage level to obtain fourth data according to a numerical relationship merely between the first reference value and the second reference value, the decoding circuit is configured to decode the fourth data, wherein the memory management circuit is further configured to obtain a third reference value according to the fourth data and target data, wherein the target data is one of the second data and the third data, and the third reference value reflects a data variation status between the fourth data and the target data, the memory management circuit is further configured to send a fifth read command sequence which instructs a reading of the first physical unit based on a fifth read voltage level to obtain fifth data according to the third reference value, the decoding circuit is further configured to decode the fifth data, wherein a first voltage gap is a voltage difference between a voltage value of the fourth read voltage level and a voltage value of the second read voltage level or a voltage value of the third read voltage level, wherein a second voltage gap is a voltage difference between a voltage value of the fifth read voltage level and a voltage value of one of the first read voltage level, the second read voltage level, the third read voltage level, and the fourth read voltage level, wherein a voltage of the second voltage gap is half of a voltage of the first voltage gap, wherein the memory management circuit is further configured to collect information which is obtained by reading the first physical unit based on a plurality of read voltage levels before entering a soft bit decoding mode, and the plurality of read voltage levels comprise the first read voltage level, the second read voltage level, the third read voltage level, the fourth read voltage level, and the fifth read voltage level, the memory management circuit is further configured to obtain reliability information corresponding to the first physical unit according to the collected information, and the memory management circuit is further configured to instruct the decoding circuit to perform a decode operation according to the reliability information before entering the soft bit decoding mode, wherein the reliability information is determined according to at least two or more voltage gaps.

16. The memory control circuit unit according to claim 15, wherein a voltage value of the first read voltage level is higher than a voltage value of the second read voltage level, a voltage value of the third read voltage level is higher than the voltage value of the first read voltage level, and an operation of sending the fourth read command sequence which instructs the reading of the first physical unit based on the fourth read voltage level to obtain the fourth data according to the numerical relationship between the first reference value and the second reference value by the memory management circuit comprises:

determining the fourth read voltage level according to the numerical relationship between the first reference value and the second reference value.

17. The memory control circuit unit according to claim 16, wherein an operation of determining the fourth read voltage level according to the numerical relationship between the first reference value and the second reference value by the memory management circuit comprises:

determining the fourth read voltage level and a voltage value of the determined fourth read voltage level is higher than the voltage value of the third read voltage level if the numerical relationship between the first reference value and the second reference value is a first numerical relationship; and determining the fourth read voltage level and the voltage value of the determined fourth read voltage level is lower than the voltage value of the second read voltage level if the numerical relationship between the first reference value and the second reference value is a second numerical relationship.

18. The memory control circuit unit according to claim 15, wherein a voltage value of the fifth read voltage level is located between a voltage value of the second read voltage level and a voltage value of the third read voltage level.

19. The memory control circuit unit according to claim 15, wherein a voltage value of the fourth read voltage level is higher than a voltage value of the third read voltage level, and a voltage value of the fifth read voltage level is higher than the voltage value of the fourth read voltage level.

20. The memory control circuit unit according to claim 15, wherein a voltage value of the fourth read voltage level is lower than a voltage value of the second read voltage level, and a voltage value of the fifth read voltage level is lower than the voltage value of the fourth read voltage level.

21. The memory control circuit unit according to claim 15, wherein the decoding circuit is further configured to decode the first data, the decoding circuit is further configured to decode one of the second data and the third data after decoding the first data, and the decoding circuit is further configured to decode the other one of the second data and the third data after the one of the second data and the third data is decoded.

* * * * *